(12) United States Patent
Chamness

(10) Patent No.: US 7,328,126 B2
(45) Date of Patent: Feb. 5, 2008

(54) METHOD AND SYSTEM OF DIAGNOSING A PROCESSING SYSTEM USING ADAPTIVE MULTIVARIATE ANALYSIS

(75) Inventor: Kevin Andrew Chamness, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 67 days.

(21) Appl. No.: 10/660,697

(22) Filed: Sep. 12, 2003

(65) Prior Publication Data
US 2005/0060103 A1    Mar. 17, 2005

(51) Int. Cl.
*G06F 11/30* (2006.01)

(52) U.S. Cl. .................. 702/182; 702/81; 702/189; 700/108

(58) Field of Classification Search ............ 702/33–35, 702/57, 58, 81, 113, 182–183, 189–191, 194, 702/196, 197, 84, 185; 700/108–110, 121
See application file for complete search history.

(56) References Cited

U.S. PATENT DOCUMENTS

| | | | |
|---|---|---|---|
| 5,796,606 A * | 8/1998 | Spring | 700/9 |
| 5,949,678 A * | 9/1999 | Wold et al. | 700/83 |
| 6,330,526 B1 * | 12/2001 | Yasuda | 703/2 |
| 6,470,230 B1 | 10/2002 | Toprac et al. | 700/121 |
| 6,622,059 B1 * | 9/2003 | Toprac et al. | 700/121 |
| 6,675,137 B1 * | 1/2004 | Toprac et al. | 703/2 |
| 6,896,763 B2 * | 5/2005 | Balasubramhanya et al. | 156/345.24 |
| 2002/0072882 A1 * | 6/2002 | Kruger et al. | 703/2 |
| 2002/0107858 A1 * | 8/2002 | Lundahl et al. | 707/100 |
| 2003/0055523 A1 * | 3/2003 | Bunkofske et al. | 700/108 |
| 2003/0065462 A1 | 4/2003 | Potyrailo | 702/81 |
| 2003/0144746 A1 * | 7/2003 | Hsiung et al. | 700/28 |
| 2005/0055175 A1 * | 3/2005 | Jahns et al. | 702/182 |

FOREIGN PATENT DOCUMENTS

EP         0 660 211 A2    6/1995

(Continued)

OTHER PUBLICATIONS

Cherry et al., "Semiconductor Process Monitoring and Fault Detection Using Recursive Multi-Way PCA", TWMCC Feb. 19, 2002.*

(Continued)

*Primary Examiner*—Jeffrey R West
(74) *Attorney, Agent, or Firm*—Oblon, Spivak, McClelland, Maier & Neustadt, P.C.

(57) ABSTRACT

A method and system of monitoring a processing system and for processing a substrate during the course of semiconductor manufacturing. As such, data is acquired from the processing system for a plurality of observations, the data including a plurality of data parameters. A principal components analysis (PCA) model is constructed from the data and includes centering coefficients. Additional data is acquired from the processing system, the additional data including an additional observation of the plurality of data parameters. The centering coefficients are adjusted to produce updated adaptive centering coefficients for each of the data parameters in the PCA model. The updated adaptive centering coefficients are applied to each of the data parameters in the PCA model. At least one statistical quantity is determined from the additional data using the PCA model. A control limit is set for the statistical quantity and compared to the statistical quantity.

44 Claims, 15 Drawing Sheets

FOREIGN PATENT DOCUMENTS

| | | |
|---|---|---|
| WO | WO 95/18420 | 7/1995 |
| WO | WO 02/23289 A2 | 3/2002 |

OTHER PUBLICATIONS

Shirazi et al., "A Modular Realization of Adaptive PCA" 1997 IEEE International Conference on Systems, Man, and Cybernetics, 1997. 'Computational Cybernetics and Simulation'. vol. 4, Oct. 12-15, 1997 pp. 3053-3056.*

Chatterjee et al., "Algorithms for Accelerated Convergence of Adaptive PCA" IEEE Transactions on Neural Networks, vol. 11, Issue 2, Mar. 2000 pp. 338-355.*

Cherry et al., "Semiconductor Process Monitoring and Fault Detection Using Recursive Multi-Way PCA", TWMCC Feb. 19, 2002.*

Shirazi et al., "A Modular Realization of Adaptive PCA" 1997 IEEE International Conference on Systems, Man, and Cybernetics, 1997. 'Computational Cybernetics and Simulation'. vol. 4, Oct. 12-15, 1997 pp. 3053-3056.*

Chatterjee et al., "Algorithms for Accelerated Convergence of Adaptive PCA" IEEE Transactions on Neural Networks, vol. 11, Issue 2, Mar. 2000 pp. 338-355.*

Li et al., "Recursive PCA for adaptive process monitoring", Department of Chemical Engineering, The University of Texas at Austin, Austin, TX. Available online Aug. 21, 2000.*

Cherry et al., "Semiconductor Process Monitoring and Fault Detection Using Recursive Multi-Way PCA", TWMCC Feb. 19, 2002.*

Shirazi et al., "A Modular Realization of Adaptive PCA" 1997 IEEE International Conference on Systems, Man, and Cybernetics, 1997. 'Computational Cybernetics and Simulation'. vol. 4, Oct. 12-15, 1997 pp. 3053-3056.*

Chatterjee et al., "Algorithms for Accelerated Convergence of Adaptive PCA" IEEE Transactions on Neural Networks, vol. 11, Issue 2, Mar. 2000 pp. 338-355.*

Cherry et al., "Semiconductor Process Monitoring and Fault Detection Using Recursive Multi-Way PCA", TWMCC Feb. 19, 2002.*

Shirazi et al., "A Modular Realization of Adaptive PCA" 1997 IEEE International Conference on Systems, Man, and Cybernetics, 1997. 'Computational Cybernetics and Simulation'. vol. 4, Oct. 12-15, 1997 pp. 3053-3056.*

Chatterjee et al., "Algorithms for Accelerated Convergence of Adaptive PCA" IEEE Transactions on Neural Networks, vol. 11, Issue 2, Mar. 2000 pp. 338-355.*

Li et al., "Recursive PCA for adaptive process monitoring", Department of Chemical Engineering, The University of Texas at Austin, Austin, TX. Available online Aug. 21, 2000.*

* cited by examiner

METHOD AND SYSTEM OF DIAGNOSING A PROCESSING SYSTEM USING ADAPTIVE MULTIVARIATE ANALYSIS

BACKGROUND OF THE INVENTION

1. Field of the Invention

The present invention relates to a method of diagnosing a processing system using principal components analysis (PCA), and more particularly to the utilization of an updated PCA.

2. Description of Related Art

Modeling and control of material processing systems, such as in semiconductor manufacturing, historically has been a very challenging task. Material processing systems typically run a variety of process recipes and products, each with unique chemical, mechanical, and electrical characteristics. Material processing systems also undergo frequent maintenance cycles wherein key parts are cleaned or replaced, and when periodic problems occur they are addressed with new hardware designs. In addition, there are particular process steps which have few substrate quality metrics directly related to their performance. Without integrated metrology, these measurements are delayed and often not measured for every substrate. These issues contribute to a complicated processing system that is already difficult to model with simple tools.

One approach to capture the behavior of a processing system in a model is to apply multivariate analysis, such as principal component analysis (PCA), to processing system data. However, due to process system drifts as well as changes in the trace data, a static PCA model is not sufficient to enable monitoring for a single processing system over a long horizon. Additionally, models developed for one processing system cannot carry over to another processing system, e.g., from one etch process chamber to another etch process chamber of the same design.

SUMMARY OF THE INVENTION

One object of the present invention is to solve or mitigate any or all of the above described problems, or other problems in the prior art.

Another object of the present invention is to provide a robust PCA model that enables monitoring for a single processing system over a long horizon.

Yet another object of the present invention is to provide a robust PCA model that is capable of useful application to more than one processing system.

These and other objects of the present invention may be met by a method of diagnosing a processing system using adaptive multivariate analysis in accordance with the present invention.

According to one aspect, a method of monitoring a processing system for processing a substrate during the course of semiconductor manufacturing is described. The method includes: acquiring data from the processing system for a plurality of observations, the data comprising a plurality of data parameters; constructing a principal components analysis (PCA) model from the data, including centering coefficients; acquiring additional data from the processing system, the additional data having an additional observation of the plurality of data parameters; adjusting the centering coefficients to produce updated adaptive centering coefficients for each of the data parameters in the PCA model; applying the updated adaptive centering coefficients to each of data parameters in the PCA model; determining at least one statistical quantity from the additional data using the PCA model; setting a control limit for the at least one statistical quantity; and comparing the at least one statistical quantity to the control limit. Additionally, the method can further include: determining scaling coefficients from the PCA model; adjusting the scaling coefficients to produce updated adaptive scaling coefficients for each of the data parameters in the PCA model; and applying the updated adaptive scaling coefficients to each of the data parameters in the PCA model.

According to another aspect, in a principal components analysis (PCA) model for monitoring a processing system for processing a substrate during the course of semiconductor manufacturing, an improvement is described including: an adaptive centering coefficient for each data parameter during a current observation of the given data parameter, the adaptive centering coefficient combining an old value of the adaptive centering coefficient and the current value of the data parameter for the current observation, wherein the old value includes the mean value of the data parameter during a plurality of observations preceding the current observation. Additionally, the improvement can further include: an adaptive scaling coefficient for each data parameter during a current observation of the given data parameter, the adaptive scaling coefficient comprising application of a recursive standard deviation filter, the formula combining an old value of the adaptive scaling coefficient, the current value of each data parameter for the current observation, and an old value of the adaptive centering coefficient, wherein the old value of the adaptive scaling coefficient comprises the standard deviation of the data parameter during a plurality of observations preceding the current observation and the old value of the adaptive centering coefficient comprises the mean value of the data parameter during a plurality of observations preceding the current observation.

Additionally, according to another aspect, a processing system for processing a substrate during the course of semiconductor manufacturing including: a process tool; and a process performance monitoring system coupled to the process tool having a plurality of sensors coupled to the process tool, and a controller coupled to the plurality of sensors and the process tool, wherein the controller includes means for acquiring data from the plurality of sensors for a plurality of observations, the data including a plurality of data parameters; means for constructing a principal components analysis (PCA) model from the data, including centering coefficients; means for acquiring additional data from the plurality of sensors; means for adjusting the centering coefficients to produce updated adaptive centering coefficients for each of the data parameters; means for applying the updated adaptive centering coefficients to each of the data parameters in the PCA model; means for determining at least one statistical quantity from the additional data using the PCA model; means for setting a control limit for the at least one statistical quantity; and means for comparing the at least one statistical quantity to the control limit. Additionally, the processing system can further include: means for determining scaling coefficients from the PCA model; means for adjusting the scaling coefficients to produce updated adaptive scaling coefficients for each of the data parameters in the PCA model; and means for applying the updated adaptive scaling coefficients to each of the data parameters in the PCA model.

According to another aspect, a process performance monitoring system to monitor a processing system for processing a substrate during the course of semiconductor manufacturing is described including: a plurality of sensors coupled to the processing system; and a controller coupled to the plurality of sensors and the processing system, wherein the controller includes means for acquiring data from the plurality of sensors for a plurality of observations, the data having a plurality of data variables; means for acquiring data from the plurality of sensors for a plurality of observations, the data comprising a plurality of data parameters; means for constructing a principal components analysis (PCA) model from the data, including centering coefficients; means for acquiring additional data from the plurality of sensors; means for adjusting the centering coefficients to produce updated adaptive centering coefficients for each of the data parameters; means for applying the updated adaptive centering coefficients to each of the data parameters in the PCA model; means for determining at least one statistical quantity from the additional data using the PCA model; means for setting a control limit for the at least one statistical quantity; and means for comparing the at least one statistical quantity to the control limit. Additionally, the processing system can further include: means for determining scaling coefficients from the PCA model; means for adjusting the scaling coefficients to produce updated adaptive scaling coefficients for each of the data parameters in the PCA model; and means for applying the updated adaptive scaling coefficients to each of the data parameters in the PCA model.

According to another aspect, a method of monitoring a first processing system for processing a substrate during the course of semiconductor manufacturing is described. The method includes: acquiring data from a second processing system for a plurality of observations, the data having a plurality of data parameters; constructing a principal components analysis (PCA) model from the data for the second processing system, including centering coefficients; acquiring additional data from the first processing system, the additional data includes an additional observation of the plurality of data parameters; adjusting the centering coefficients to produce updated adaptive centering coefficients for each of the data parameters in the PCA model; applying the updated adaptive centering coefficients to each of the data parameters in the PCA model; determining at least one statistical quantity from the additional data using the PCA model; setting a control limit for the at least one statistical quantity; and comparing the at least one statistical quantity to the control limit. Additionally, the method can further include: determining scaling coefficients from the PCA model; adjusting the scaling coefficients to produce updated adaptive scaling coefficients for each of the data parameters in the PCA model; and applying the updated adaptive scaling coefficients to each of the data parameters in the PCA model.

According to another aspect, a method for classifying a process fault occurring during a plurality of substrate runs in a processing system is described. The method includes: monitoring a plurality of data parameters from the processing system for each substrate run within the plurality of substrate runs; identifying a fault substrate run, within the plurality of substrate runs using multivariate analysis, in which the process fault occurred; selecting a first substrate run preceding the fault substrate run; calculating a first plurality of mean values for each of the plurality of data parameters during the first substrate run; selecting a second substrate run following the fault substrate run; calculating a second plurality of mean values for each of the plurality of data parameters during the second substrate run; determining the absolute value of a plurality of differences between the second plurality of mean values and the first plurality of mean values for each of the plurality of data parameters; calculating a plurality of standard deviations for each of the plurality of data parameters during at least one of the first substrate run and the second substrate run; normalizing the plurality of differences by the plurality of standard deviations for each of the plurality of data parameters; determining the largest value of the normalized differences; and identifying the data parameter amongst the plurality of data parameters corresponding to the largest value of the differences.

According to another aspect, a method for classifying a process fault occurring during a plurality of substrate runs in a processing system is described. The method includes: monitoring a plurality of data parameters from the processing system for each substrate run within the plurality of substrate runs; identifying a fault substrate run, within the plurality of substrate runs using multivariate analysis, in which the process fault occurred; selecting a first substrate run preceding the fault substrate run; calculating a first plurality of standard deviations for each of the plurality of data parameters during the first substrate run; selecting a second substrate run following the fault substrate run; calculating a second plurality of standard deviations for each of the plurality of data parameters during the second substrate run; determining the absolute value of a plurality of differences between the second plurality of standard deviations and the first plurality of standard deviations for each of the plurality of data parameters; calculating a plurality of mean values for each of the plurality of data parameters during one of the first substrate run and the second substrate run; normalizing the plurality of differences by the plurality of mean values for each of the plurality of data parameters; determining the largest value of the normalized differences; and identifying the data parameter amongst the plurality of data parameters corresponding to the largest value of the differences.

BRIEF DESCRIPTION OF THE DRAWINGS

In the accompanying drawings.

DETAILED DESCRIPTION OF AN EMBODIMENT

Figure 1:
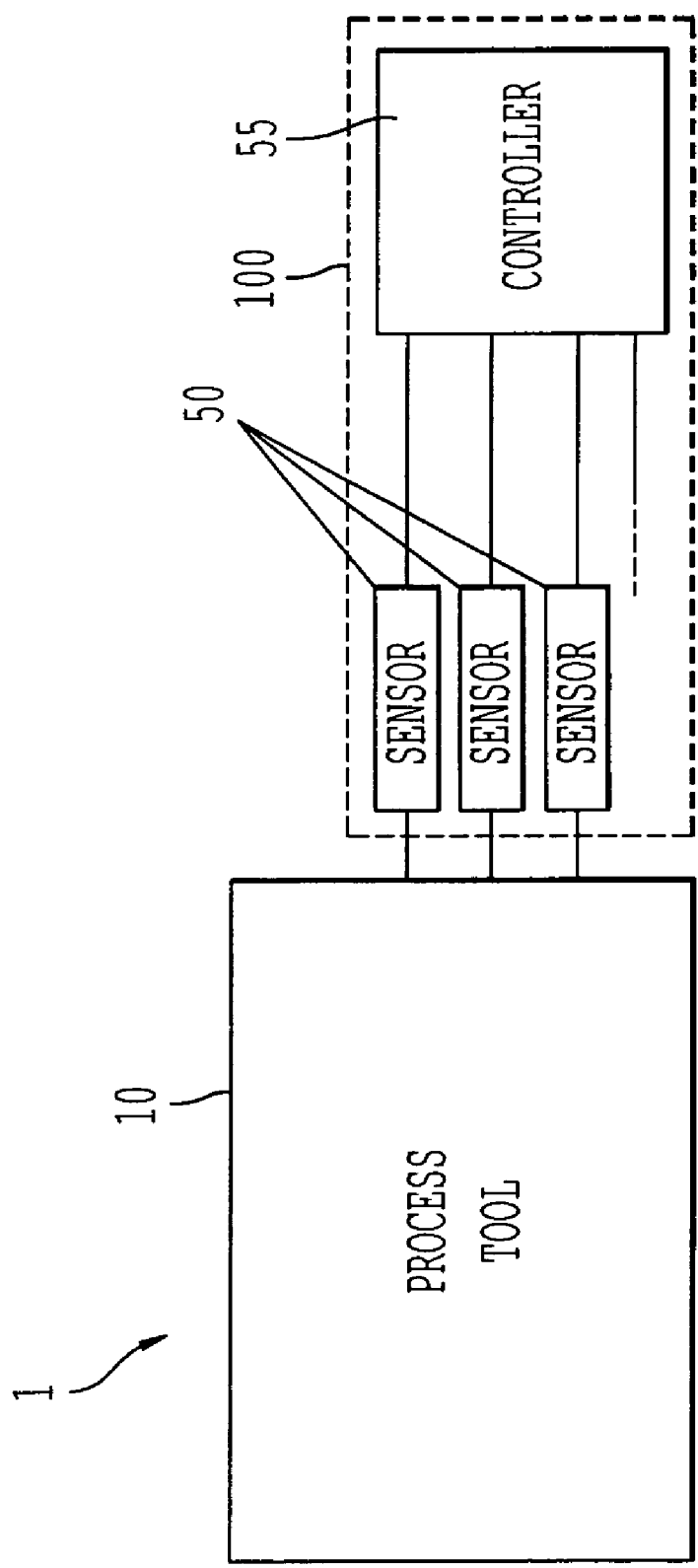
FIG. 1 shows a material processing system according to a preferred embodiment of the present invention.

According to an embodiment of the present invention, a material processing system 1 is depicted in FIG. 1 that includes a process tool 10 and a process performance monitoring system 100. The process performance monitoring system 100 includes a plurality of sensors 50 and a controller 55. Alternately, the material processing system 1 can include a plurality of process tools 10. The sensors 50 are coupled to the process tool 10 to measure tool data and the controller 55 is coupled to the sensors 50 in order to receive tool data. Alternately, the controller 55 is further coupled to process tool 10. Moreover, the controller 55 is configured to monitor the performance of processing system 1 using the (tool) data parameters. The process performance can, for example, include the detection of process faults.

In the illustrated embodiment depicted in FIG. 1, the material processing system 1 utilizes a plasma for material processing. Desirably, the material processing system 1 includes an etch chamber. Alternately, the material processing system 1 includes a photoresist coating chamber such as, for example, a photoresist spin coating system; a photoresist patterning chamber such as, for example, an ultraviolet (UV) lithography system; a dielectric coating chamber such as, for example, a spin-on-glass (SOG) or spin-on-dielectric (SOD) system; a deposition chamber such as, for example, a chemical vapor deposition (CVD) system or a physical vapor deposition (PVD) system; a rapid thermal processing (RTP) chamber such as, for example, a RTP system for thermal annealing; or a batch-processing vertical furnace.

Figure 2:
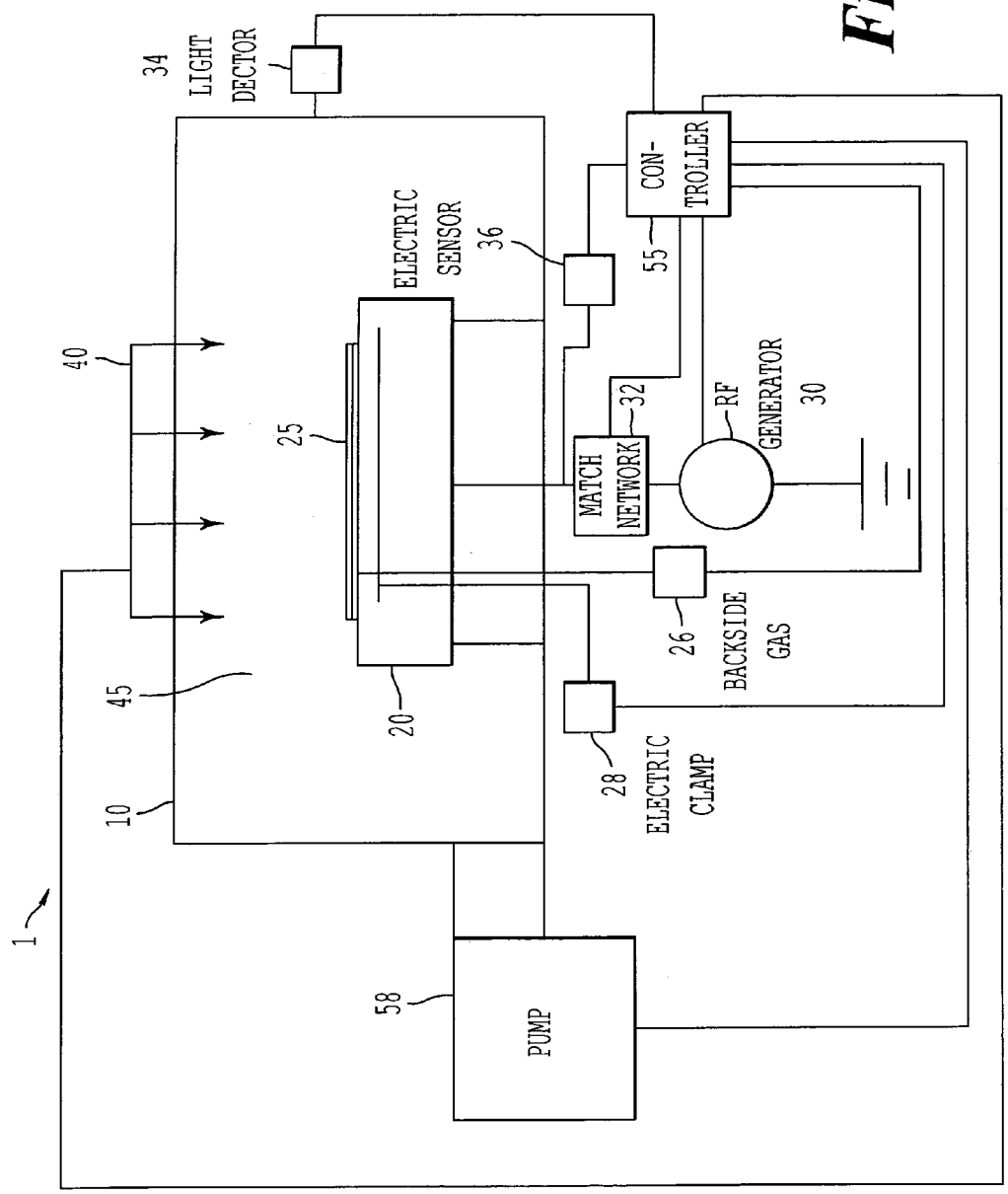
FIG. 2 shows a material processing system according to one embodiment of the present invention.

According to the illustrated embodiment of the present invention depicted in FIG. 2, the material processing system 1 includes process tool 10, substrate holder 20, upon which a substrate 25 to be processed is affixed, gas injection system 40, and vacuum pumping system 58. Substrate 25 can be, for example, a semiconductor substrate, a wafer, or a liquid crystal display (LCD). Process tool 10 can be, for example, configured to facilitate the generation of plasma in processing region 45 adjacent a surface of substrate 25, where plasma is formed via collisions between heated electrons and an ionizable gas. An ionizable gas or mixture of gases is introduced via gas injection system 40, and the process pressure is adjusted. Desirably, plasma is utilized to create materials specific to a predetermined materials process, and to aid either the deposition of material to substrate 25 or the removal of material from the exposed surfaces of substrate 25. For example, controller 55 can be used to control vacuum pumping system 58 and gas injection system 40.

Substrate 25 can be, for example, transferred into and out of process tool 10 through a slot valve (not shown) and chamber feed-through (not shown) via robotic substrate transfer system where it is received by substrate lift pins (not shown) housed within substrate holder 20 and mechanically translated by devices housed therein. Once substrate 25 is received from substrate transfer system, it is lowered to an upper surface of substrate holder 20.

For example, substrate 25 can be affixed to the substrate holder 20 via an electrostatic clamping system 28. Furthermore, substrate holder 20 can further include a cooling system including a re-circulating coolant flow that receives heat from substrate holder 20 and transfers heat to a heat exchanger system (not shown), or when heating, transfers heat from the heat exchanger system. Moreover, gas can be delivered to the back-side of the substrate via a backside gas system 26 to improve the gas-gap thermal conductance between substrate 25 and substrate holder 20. Such a system can be utilized when temperature control of the substrate is required at elevated or reduced temperatures. For example, temperature control of the substrate can be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermo-electric heaters/coolers can be included.

As shown in FIG. 2, substrate holder 20 includes an electrode through which RF power is coupled to plasma in processing region 45. For example, substrate holder 20 can be electrically biased at an RF voltage via the transmission of RF power from RF generator 30 through impedance match network 32 to substrate holder 20. The RF bias can serve to heat electrons to form and maintain plasma. In this configuration, the system can operate as a reactive ion etch (RIE) reactor, where the chamber and upper gas injection electrode serve as ground surfaces. A typical frequency for the RF bias can range from 1 MHz to 100 MHz and is preferably 13.56 MHz.

Alternately, RF power can be applied to the substrate holder electrode at multiple frequencies. Furthermore, impedance match network 32 serves to maximize the transfer of RF power to plasma in processing chamber 10 by minimizing the reflected power. Various match network topologies (e.g., L-type, π-type, T-type, etc.) and automatic control methods can be utilized.

With continuing reference to FIG. 2, process gas can be, for example, introduced to processing region 45 through gas injection system 40. Process gas can, for example, include a mixture of gases such as argon, $CF_4$ and $O_2$, or argon, $C_4F_8$ and $O_2$ for oxide etch applications, or other chemistries such as, for example, $O_2/CO/Ar/C_4F_8$, $O_2/CO/Ar/C_5F_8$, $O_2/CO/Ar/C_4F_6$, $O_2/Ar/C_4F_6$, $N_2/H_2$. Gas injection system 40 includes a showerhead, where process gas is supplied from a gas delivery system (not shown) to the processing region 45 through a gas injection plenum (not shown), a series of baffle plates (not shown) and a multi-orifice showerhead gas injection plate (not shown).

Vacuum pump system 58 can, for example, include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is generally employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump can be used. Furthermore, a device for monitoring chamber pressure (not shown) is coupled to the process chamber 10. The pressure measuring device can be, for example, a Type 628B Baratron absolute capacitance manometer commercially available from MKS Instruments, Inc. (Andover, MA).

As depicted in FIG. 1, process performance monitoring system 100 includes plurality of sensors 50 coupled to process tool 10 to measure tool data and controller 55 coupled to the sensors 50 to receive tool data. The sensors 50 can include both sensors that are intrinsic to the process tool 10 and sensors extrinsic to the process tool 10. Sensors intrinsic to process tool 10 can include those sensors pertaining to the functionality of process tool 10 such as the measurement of the Helium backside gas pressure, Helium backside flow, electrostatic chuck (ESC) voltage, ESC current, substrate holder 20 temperature (or lower electrode (LEL) temperature), coolant temperature, upper electrode (UEL) temperature, forward RF power, reflected RF power, RF self-induced DC bias, RF peak-to-peak voltage, chamber wall temperature, process gas flow rates, process gas partial pressures, chamber pressure, capacitor settings (i.e., $C_1$ and $C_2$ positions), a focus ring thickness, RF hours, focus ring RF hours, and any statistic thereof. Alternatively, sensors extrinsic to process tool 10 can include those not directly related to the functionality of process tool 10 such as a light detection device 34 for monitoring the light emitted from the plasma in processing region 45 as shown in FIG. 2, or an electrical measurement device 36 for monitoring the electrical system of process tool 10 as shown in FIG. 2.

The light detection device 34 can include a detector such as a (silicon) photodiode or a photomultiplier tube (PMT) for measuring the total light intensity emitted from the plasma. The light detection device 34 can further include an optical filter such as a narrow-band interference filter. In an alternate embodiment, the light detection device 34 includes a line CCD (charge coupled device) or CID (charge injection device) array and a light dispersing device such as a grating or a prism. Additionally, light detection device 34 can include a monochromator (e.g., grating/detector system) for measuring light at a given wavelength, or a spectrometer (e.g., with a rotating grating) for measuring the light spectrum such as, for example, the device described in U.S. Pat. No. 5,888,337.

The light detection device 34 can include a high resolution OES sensor from Peak Sensor Systems. Such an OES sensor has a broad spectrum that spans the ultraviolet (UV), visible (VIS) and near infrared (NIR) light spectrums. In the Peak Sensor System, the resolution is approximately 1.4 Angstroms, that is, the sensor is capable of collecting 5550 wavelengths from 240 to 1000 nm. In the Peak System Sensor, the sensor is equipped with high sensitivity miniature fiber optic UV-VIS-NIR spectrometers which are, in turn, integrated with 2048 pixel linear CCD arrays.

The spectrometers in one embodiment of the present invention receive light transmitted through single and bundled optical fibers, where the light output from the optical fibers is dispersed across the line CCD array using a fixed grating. Similar to the configuration described above, light emitting through an optical vacuum window is focused onto the input end of the optical fibers via a convex spherical lens. Three spectrometers, each specifically tuned for a given spectral range (UV, VIS and NIR), form a sensor for a process chamber. Each spectrometer includes an independent A/D converter. And lastly, depending upon the sensor utilization, a full emission spectrum can be recorded every 0.1 to 1.0 seconds.

The electrical measurement device 36 can include, for example, a current and/or voltage probe, a power meter, or spectrum analyzer. For example, plasma processing systems often employ RF power to form plasma, in which case, an RF transmission line, such as a coaxial cable or structure, is employed to couple RF energy to the plasma through an electrical coupling element (i.e., inductive coil, electrode, etc.). Electrical measurements using, for example, a current-voltage probe, can be exercised anywhere within the electrical (RF) circuit, such as within an RF transmission line. Furthermore, the measurement of an electrical signal, such as a time trace of voltage or current, permits the transformation of the signal into frequency space using discrete Fourier series representation (assuming a periodic signal). Thereafter, the Fourier spectrum (or for a time varying signal, the frequency spectrum) can be monitored and analyzed to characterize the state of material processing system 1. A voltage-current probe can be, for example, a device as described in detail in pending U.S. Application Ser. No. 60/259,862 filed on Jan. 8, 2001, and U.S. Pat. No. 5,467,013, each of which is incorporated herein by reference in its entirety.

In alternate embodiments, electrical measurement device 36 can include a broadband RF antenna useful for measuring a radiated RF field external to material processing system 1. A commercially available broadband RF antenna is a broadband antenna such as Antenna Research Model RAM-220 (0.1 MHz to 300 MHz).

In general, the plurality of sensors 50 can include any number of sensors, intrinsic and extrinsic, which can be coupled to process tool 10 to provide tool data to the controller 55.

Controller 55 includes a microprocessor, memory, and a digital I/O port (potentially including D/A and/or A/D converters) capable of generating control voltages sufficient to communicate and activate inputs to material processing system 1 as well as monitor outputs from material processing system 1. As shown in FIG. 2, controller 55 can be coupled to and exchange information with RF generator 30, impedance match network 32, gas injection system 40, vacuum pump system 58, backside gas delivery system 26, electrostatic clamping system 28, light detection device 34, and electrical measurement device 36. A program stored in the memory is utilized to interact with the aforementioned components of a material processing system 1 according to a stored process recipe. One example of controller 55 is a DELL PRECISION WORKSTATION 530™, available from Dell Corporation, Austin, Tex. Controller 55 can be locally located relative to the material processing system 1, or it can be remotely located relative to the material processing system 1. For example, controller 55 can exchange data with material processing system 1 using at least one of a direct connection, an intranet, and the internet. Controller 55 can be coupled to an intranet at, for example, a customer site (i.e., a device maker, etc.), or it can be coupled to an intranet at, for example, a vendor site (i.e., an equipment manufacturer). Additionally, for example, controller 55 can be coupled to the internet. Furthermore, another computer (i.e., controller, server, etc.) can, for example, access controller 55 to exchange data via at least one of a direct connection, an intranet, and the internet.

Figure 3:
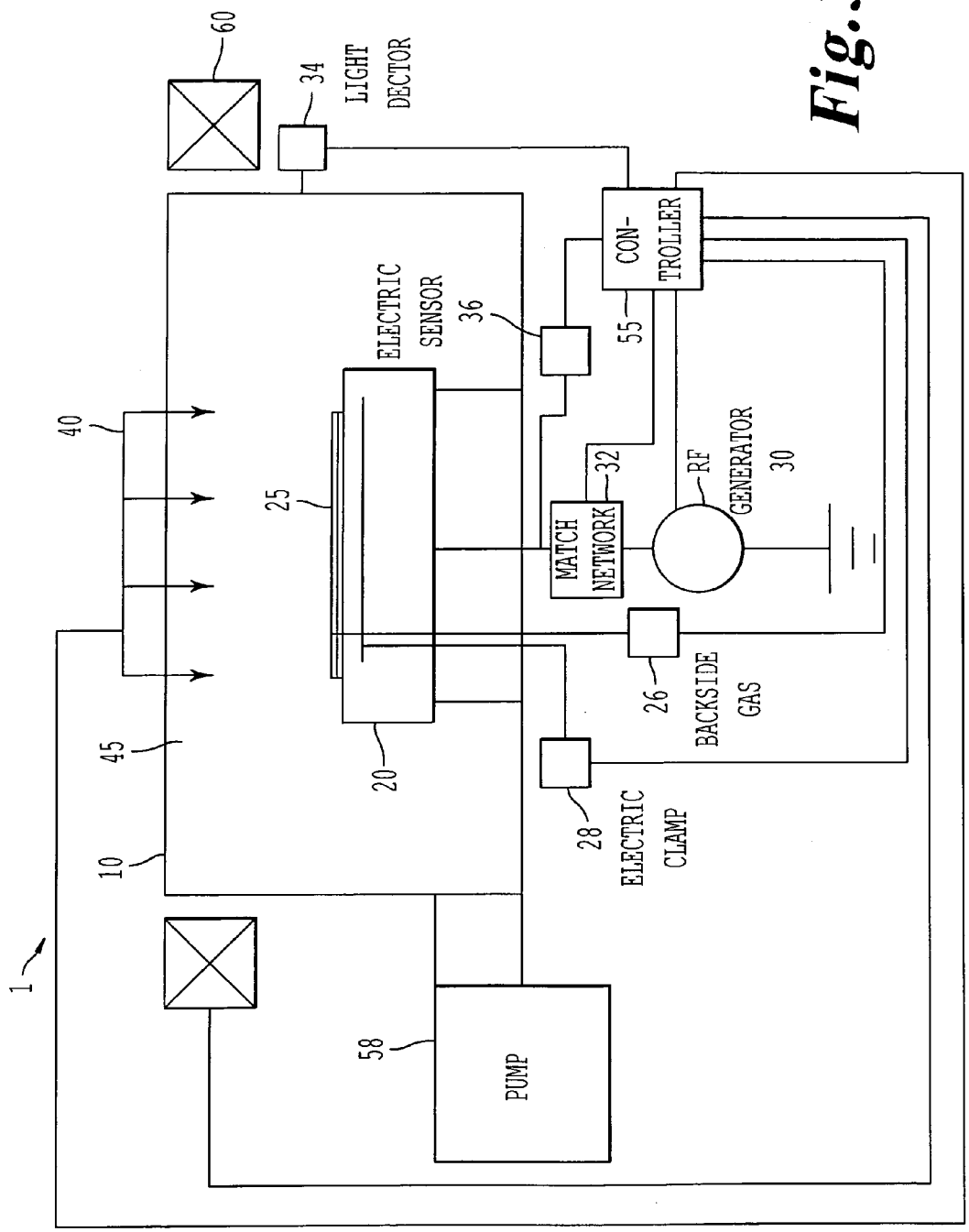
FIG. 3 shows a material processing system according to another embodiment of the present invention.

As shown in FIG. 3, material processing system 1 can include a magnetic field system 60. For example, the magnetic field system 60 can include a stationary, or either a mechanically or electrically rotating DC magnetic field in order to potentially increase plasma density and/or improve material processing uniformity. Moreover, controller 55 can be coupled to magnetic field system 60 in order to regulate the field strength or speed of rotation.

Figure 4:
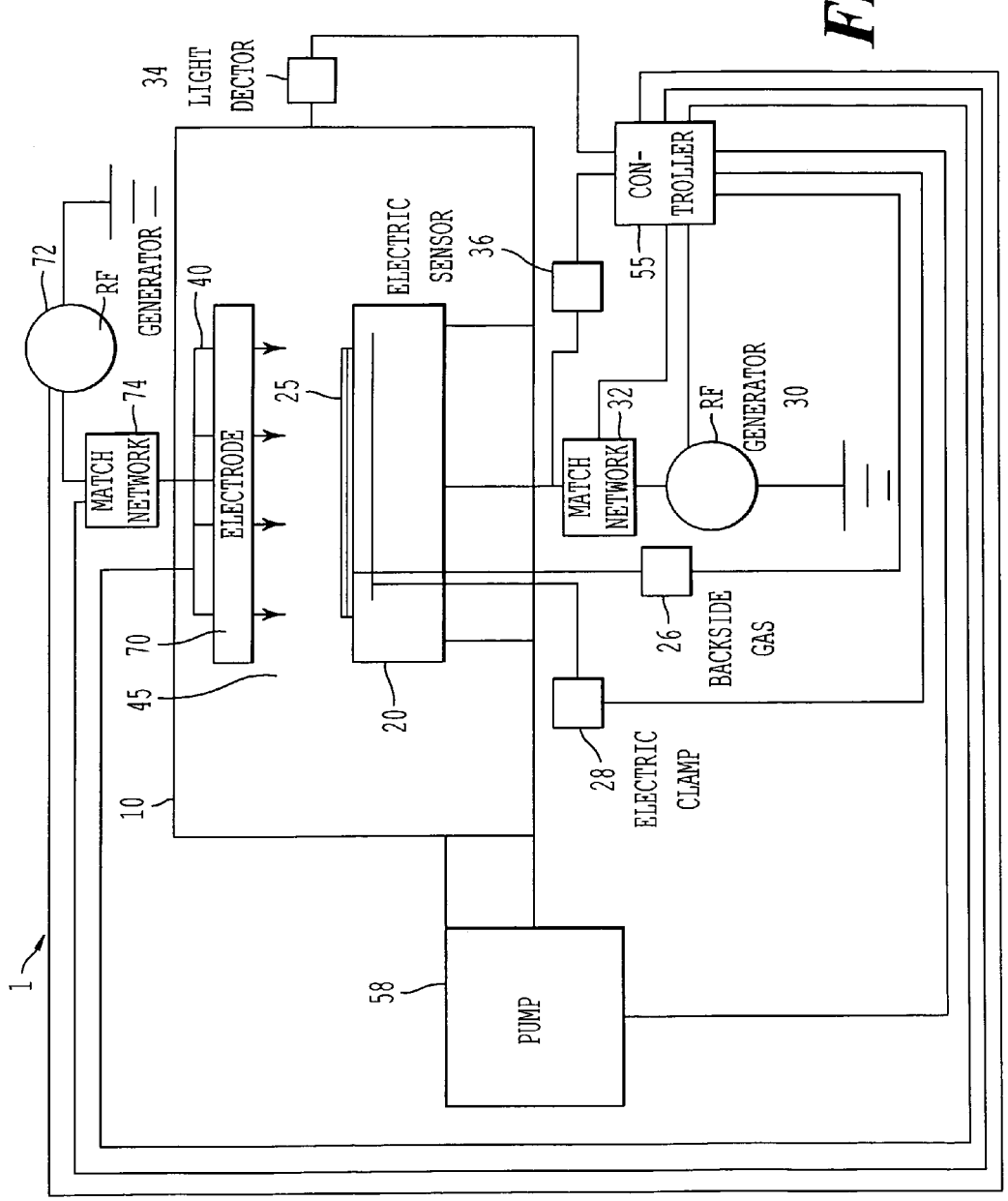
FIG. 4 shows a material processing system according to a further embodiment of the present invention.

As shown in FIG. 4, the material processing system can include an upper electrode 70. For example, RF power can be coupled from RF generator 72 through impedance match network 74 to upper electrode 70. A frequency for the application of RF power to the upper electrode preferably ranges from 10 MHz to 200 MHz and is preferably 60 MHz. Additionally, a frequency for the application of power to the lower electrode can range from 0.1 MHz to 30 MHz and is preferably 2 MHz. Moreover, controller 55 can be coupled to RF generator 72 and impedance match network 74 in order to control the application of RF power to upper electrode 70.

Figure 5:
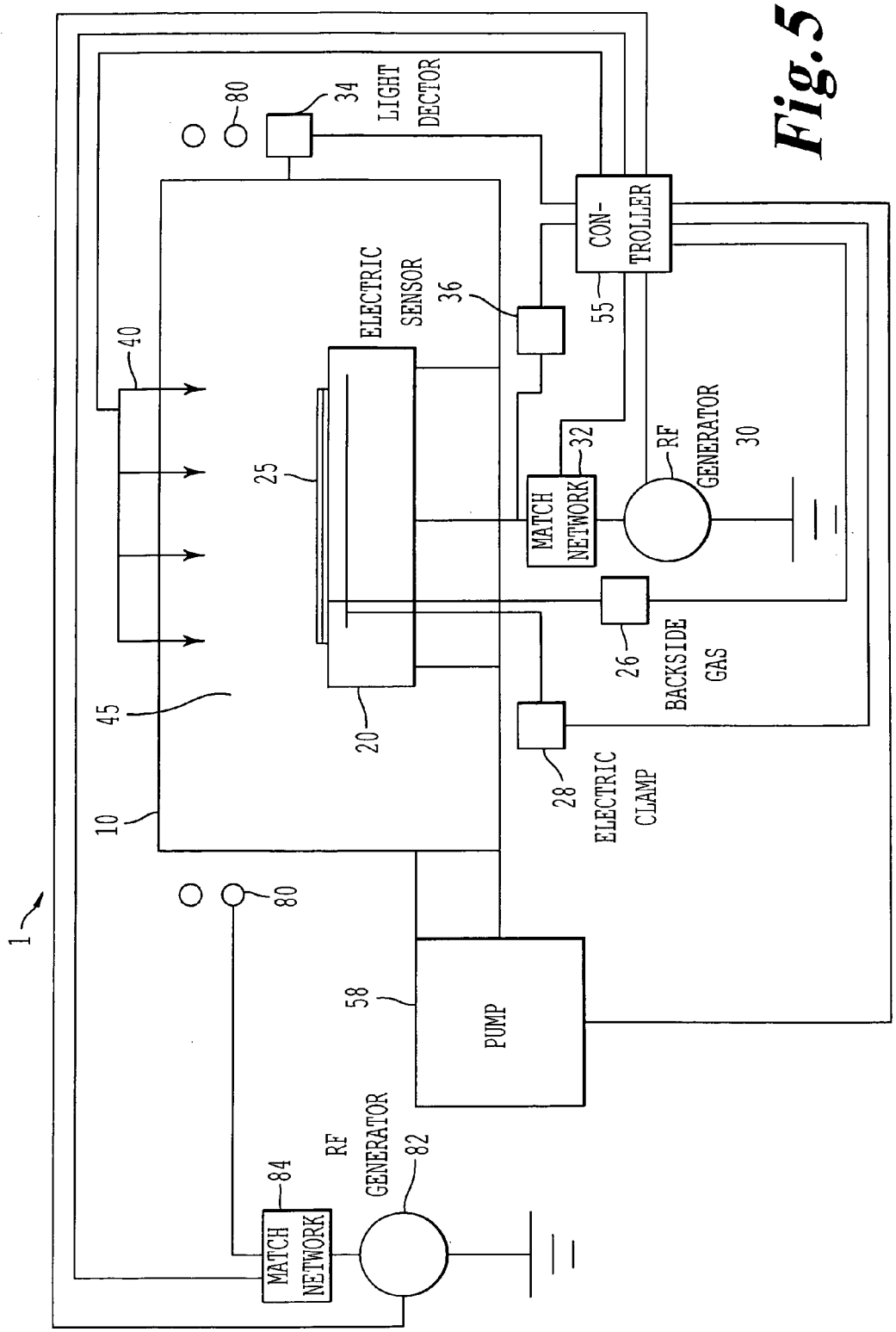
FIG. 5 shows a material processing system according to an additional embodiment of the present invention.

As shown in FIG. 5, the material processing system of FIG. 1 can include an inductive coil 80. For example, RF power can be coupled from RF generator 82 through impedance match network 84 to inductive coil 80, and RF power can be inductively coupled from inductive coil 80 through dielectric window (not shown) to plasma processing region 45. A frequency for the application of RF power to the inductive coil 80 preferably ranges from 10 MHz to 100 MHz and is preferably 13.56 MHz. Similarly, a frequency for the application of power to the chuck electrode preferably ranges from 0.1 MHz to 30 MHz and is preferably 13.56 MHz. In addition, a slotted Faraday shield (not shown) can be employed to reduce capacitive coupling between the inductive coil 80 and plasma. Moreover, controller 55 can be coupled to RF generator 82 and impedance match network 84 in order to control the application of power to inductive coil 80. In an alternate embodiment, inductive coil 80 can be a "spiral" coil or "pancake" coil in communication with the plasma processing region 45 from above as in a transformer coupled plasma (TCP) reactor.

Alternately, the plasma can be formed using electron cyclotron resonance (ECR). In yet another embodiment, the plasma is formed from the launching of a Helicon wave. In yet another embodiment, the plasma is formed from a propagating surface wave.

As discussed above, the process performance monitoring system 100 includes plurality of sensors 50 and controller 55, where the sensors 50 are coupled to process tool 10 and the controller 55 is coupled to the sensors 50 to receive tool data. The controller 55 is further capable of executing at least one algorithm to optimize the tool data received from the sensors 50, determine a relationship (model) between the tool data, and use the relationship (model) for fault detection.

When encountering large sets of data involving a substantive number of variables, multivariate analysis (MVA) is often applied. For example, one such MVA technique includes Principal Components Analysis (PCA). In PCA, a model can be assembled to extract from a large set of data a signal exhibiting the greatest variance in the multi-dimensional parameter space.

For example, each set of data parameters for a given substrate run, or instant in time, can be stored as a row in a matrix $\overline{X}$ and, hence, once the matrix $\overline{X}$ is assembled, each row represents a different substrate run, or instant in time (or observation), and each column represents a different data parameter (or data variable) corresponding to the plurality of sensors 50. Therefore, matrix $\overline{X}$ is a rectangular matrix of dimensions q by r, where q represents the row dimension and r represents the column dimension. Once the data is stored in the matrix, the data is generally mean-centered and/or normalized. The process of mean-centering the data stored in a matrix column involves computing a mean value of the column elements and subtracting the mean value from each element. Moreover, the data residing in a column of the matrix can be normalized by determining the standard deviation of the data in the column. For example, a PCA model can be constructed in a manner similar to that described in U.S. Provisional Application Ser. No. 60/470,901, entitled "A process system health index and method of using the same", filed on May 16, 2002. The entire content of this application is hereby incorporated herein by reference.

Using the PCA technique, the correlation structure within matrix $\overline{X}$ is determined by approximating matrix $\overline{X}$ with a matrix product ($\overline{T}\overline{P}^T$) of lower dimensions plus an error matrix $\overline{E}$, viz.

$$\overline{X} = \overline{T}\overline{P}^T + \overline{E}, \quad (1a)$$

where $$\overline{X}_{i,j} = \left( \frac{X^*_{i,j} - \overline{X}_{M,j}}{\sigma_{x,j}} \right), \quad (1b)$$

"i" represents the $i^{th}$ row, "j" represents the $j^{th}$ column, subscript "M" represents mean value, σ represents standard deviation, $\overline{X}^*$ is the raw data, $\overline{T}$ is a (q by p) matrix of scores that summarizes the $\overline{X}$-variables, and $\overline{P}$ is a (r by p, where p≤r) matrix of loadings showing the influence of the variables.

In general, the loadings matrix $\overline{P}$ can be shown to comprise the eigenvectors of the covariance matrix of $\overline{X}$, where the covariance matrix $\overline{S}$ can be shown to be $$\overline{S} = \overline{X}^T \overline{X}. \quad (2)$$

The covariance matrix $\overline{S}$ is a real, symmetric matrix; and, therefore, the covariance matrix can be described as $$\overline{S} = \overline{U}\overline{\Lambda}\overline{U}^T, \quad (3)$$

where the real, symmetric eigenvector matrix $\overline{U}$ comprises the normalized eigenvectors as columns and $\overline{\Lambda}$ is a diagonal matrix comprising the eigenvalues corresponding to each eigenvector along the diagonal. Using equations (1a) and (3) (for a full matrix of p=r; i.e. no error matrix), one can show that $$\overline{P} = \overline{U} \quad (4)$$

and $$\overline{T}^T\overline{T} = \overline{\Lambda}. \quad (5)$$

A consequence of the above eigen-analysis is that each eigenvalue represents the variance of the data in the direction of the corresponding eigenvector within n-dimensional space. Hence, the largest eigenvalue corresponds to the greatest variance in the data within the multi-dimensional space whereas the smallest eigenvalue represents the smallest variance in the data. By definition, all eigenvectors are orthogonal, and therefore, the second largest eigenvalue corresponds to the second greatest variance in the data in the direction of the corresponding eigenvector, which is, of course, normal to the direction of the first eigenvector. In general, for such analysis, the first several (three to four, or more) largest eigenvalues are chosen to approximate the data and, as a result of the approximation, an error $\overline{E}$ is introduced to the representation in equation (1a). In summary, once the set of eigenvalues and their corresponding eigenvectors are determined, a set of the largest eigenvalues can be chosen and the error matrix $\overline{E}$ of equation (1a) can be determined.

An example of commercially available software which supports PCA modeling is MATLAB™ (commercially available from The Mathworks, Inc., Natick, Mass.), and PLS Toolbox (commercially available from Eigenvector Research, Inc., Manson, Wash.).

Additionally, once a PCA model is established, commercially available software, such as MATLAB™, is further capable of producing as output other statistical quantities such as the Hotelling $T^2$ parameter for an observation, or the Q-statistic. The Q-statistic for an observation can be calculated as follows $$Q = E^T E, \quad (6a)$$

where $$\overline{E} = \overline{X}(I - \overline{PP}^T), \quad (6b)$$

and $I$ is the identity matrix of appropriate size. For example, a PCA model (loadings matrix $\overline{P}$, etc.) can be constructed using a "training" set of data (i.e. assemble $\overline{X}$ for a number of observations and determine a PCA model using MATLAB™). Once the PCA model is constructed, projections of a new observation onto the PCA model can be utilized to determine a residual matrix $\overline{E}$, as in equation (1a).

Similarly, the Hotelling $T^2$ can be calculated as follows $$T_i^2 = \sum_{a=1}^{p} \frac{\overline{T}_{ia}^2}{s_{ta}^2}, \quad (7a)$$

where $$T = \overline{XP}, \quad (7b)$$

and $T_{ia}$ is the score (from equation (7b)) for the $i^{th}$ observation (substrate run, instant in time, etc.; i.e., i=1 to q) and the $a^{th}$ model dimension (i.e., a=1 to p), and $S^2_{ta}$ is the variance of $T_a$. For example, a PCA model (loadings matrix $\overline{P}$, etc.) can be constructed using a "training" set of data (i.e. assemble $\overline{X}$ for a number of observations and determine a PCA model using MATLAB™). Once the PCA model is constructed, projections of a new observation onto the PCA model can be utilized to determine a new scores matrix $T$.

Typically, a statistical quantity, such as the Q-statistic, or the Hotelling $T^2$, is monitored for a process, and, when this quantity exceeds a pre-determined control limit, a fault for the process is detected.

Figure 6A:
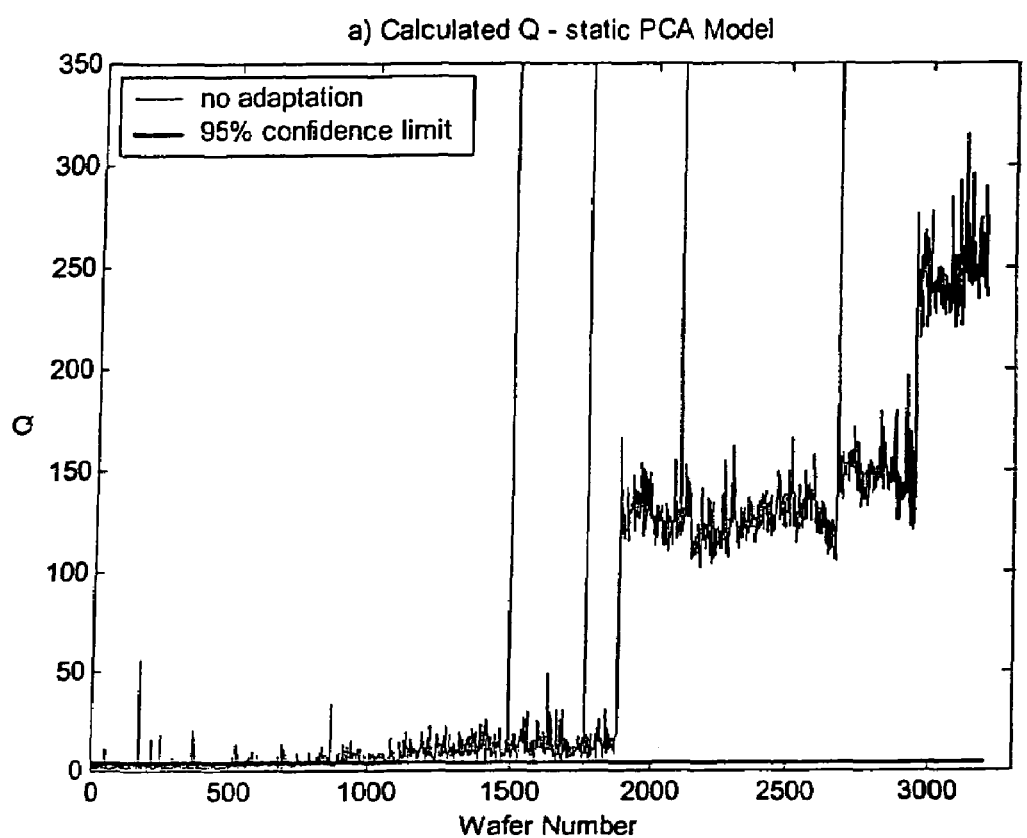
FIG. 6A presents an exemplary calculated Q-statistic using static centering and scaling coefficients.

FIG. 6A shows an example of conventional use of a PCA model to monitor the Q-statistic (Q-factor) of a process in order to determine faults in the process. In the example of FIG. 6A, the model is applied to process data acquired from Unity II DRM (Dipole Ring Magnet) CCP (Capacitively Coupled Plasma) processing systems (commercially available from Tokyo Electron Limited; see FIG. 3) that perform a patterned oxide etch with a $C_4F_8/CO/Ar+O_2$ based chemistry. This processing system operates in a batch mode with a fixed process recipe for each lot. Typically, a single recipe is utilized from lot to lot for a particular process step in the manufacture of a device. The same processing system is frequently utilized for many different device layers and steps, but for each process step, the recipe remains the same.

The data parameters collected include the chamber pressure, applied power, various temperatures, and many other variables relating to the pressure, power, and temperature control as shown in Table 1.

The process recipe used in this example has three main steps: a photoresist cleaning step, a main etch step, and a photoresist stripping step. The scope of this example applied to the main etch step, but it is not limited to this particular step or any particular step and is, therefore, applicable to other steps as well.

For each process step, an observation mean and observation standard deviation of a time trace for each data parameter (or tool variable) was calculated from roughly 160 samples for each substrate. The beginning portion of the time trace for each data parameter, where the RF power increases, was trimmed in these statistical calculations in an attempt to remove the variation due to the power when it is turned on.

In the example of FIG. 6A, a PCA model was performed for the first 500 substrates using the same recipe in a single processing system. The standard PCA methods implemented in MATLAB™ were used, with mean centering and unit variance scaling. Also, the standard Q residuals (SPE) and Q contributions were calculated using the Eigenvector Research PLS Toolbox offered by Eigenvector Research as an add-on to MATLAB™.

In the example of FIG. 6A, the PCA model was constructed from the first 500 substrates in a first processing system and was applied to all 3200 substrates from this processing system. As seen in this figure, the resulting Q statistic exceeds the 95% confidence limit in the model within less than 250 substrates after the PCA model was built (i.e. by substrate number 750), and never returns to below that level. In addition, distinct outliers and distinct step-like changes are apparent. Thus, FIG. 6A demonstrates that while a conventional PCA model constructed as described above can be used to monitor the Q-statistic, there exist periods of time where the statistical parameter deviates above the control limit never to return below. Indeed, any of the above described statistics (e.g., the Q-statistic, or the Hotelling $T^2$ parameter) can be monitored using a given model for a specific process in a specific processing system, but will eventually deviate above the control limit never to return below. Thereafter, the model is no longer applicable to the given process and given processing system.

While methods are known for preserving the usefulness of the PCA model over long process runs, the present inventors have recognized that these methods are not practical for commercial application to semiconductor manufacturing process control. For example, using an adaptive model technique, the PCA model can be actually rebuilt with each process run in order to update the model on the fly during the process. While this adaptive modeling technique may generally stabilize the statistical monitoring within a given control limit, it requires computational resources not practical for commercial processes.

Another technique for maintaining the usefulness of the statistical monitoring of FIG. 6A is to employ a more complicated control limit scheme. Specifically, the control limit can be reset for each process run based on a predicted degradation of the PCA model. While this method will avoid the indication of an out-of-process condition due to degradation of the PCA model, changing the control limit with each process run requires a complex scheme that is also impractical for commercial processes.

Thus, the present inventors have recognized that conventional methods for adapting a PCA model to enable statistical monitoring over long process runs is impractical for commercial processes. More specifically, the present inventors have discovered that the standard approach to centering and scaling the data in a PCA matrix has not enabled the development of a robust model capable of use for long periods of time (i.e., substantive number of substrate runs).

In an embodiment of the present invention, an adaptive multivariate analysis is described for preparing a robust PCA model. Therein, the centering and scaling coefficients are updated using an adaptation scheme. The mean values (utilized for centering) for each summary statistic are updated from one observation to the next using a filter, such as an exponentially weighted moving average (EWMA) filter shown as follows:

$$\overline{X}_{M,j,n} = \lambda \overline{X}_{M,j,n-1} + (1-\lambda)\overline{X}_{j,n}, \quad (8)$$

where $\overline{X}_{M,j,n}$ represents the calculated model mean value ("M") of the $j^{th}$ data parameter at the current run (or observation "n"), $\overline{X}_{M,j,n-1}$ represents the calculated model mean value ("M") of the $j^{th}$ data parameter at the previous run (or observation "n−1"), $\overline{X}_{j,n}$ represents the current value of the $j^{th}$ data parameter for the current run, and $\lambda$ is a weighting factor ranging from a value of 0 to 1. For example, when $\lambda=1$, the model mean value utilized for centering each data parameter is the previously used value, and, when $\lambda=0$, the model mean value utilized for centering each data parameter is the current measured value.

The model standard deviations (utilized for scaling) for each summary statistic are updated using the following recursive standard deviation filter $$\sigma_{X,j,n} = \sqrt{(\sigma_{X,j,n-1})^2 \left(\frac{k-2}{k-1}\right) + \frac{1}{k}(\overline{X}_{j,n} - \overline{X}_{M,j,n})^2}, \quad (9)$$

where $\sigma_{X,j,n}$ represents the calculated model standard deviation of the $j^{th}$ data parameter for the current run (or observation "n"), $\sigma_{X,j,n-1}$ represents the calculated model standard deviation of the $j^{th}$ data parameter for the previous run (or observation "n−1"), n represents the run (or observation) number, and k represents a filter constant. The filter constant k can, for example, be selected as a constant less than or equal to N, where N represents the number of substrate runs, or observations, utilized to construct the PCA model.

TABLE 1

| Area | Variable | Description |
|---|---|---|
| Gas Flow and Pressure | PRESSURE | Chamber Pressure |
| | APC | Throttle Valve Angle |
| | Ar | Ar Flow Rate |
| | C4F8 | C4F8 Flow Rate |
| | CO | CO Flow Rate |
| Power and Matching | RF-FORWARD-LO | Lower Electrode Power |
| | C1-POSITION-LO | Matching Network Capacitor 1 |
| | C2-POSITION-LO | Matching Network Capacitor 2 |
| | MAGNITUDE | Matcher Magnitude |
| | PHASE | Matcher Phase |
| | RF-VDC-LO | Lower Electrode DC Voltage |
| | RF-VPP-LO | Lower Electrode Peak to Peak Voltage |
| ES Chuck | ESC-CURRENT | Electrostatic Chuck Current |
| | ESC-VOLTAGE | Electrostatic Chuck Voltage |
| Temperature and Cooling | LOWER-TEMP | Lower Electrode Temperature |
| | UPPER-TEMP | Upper Electrode Temperature |
| | WALL-TEMP | Wall Temperature |
| | COOL-GAS-FLOW1 | He Edge Cooling Flow Rate |
| | COOL-GAS-FLOW2 | He Center Flow Rate |
| | COOL-GAS-P1 | He Edge Cooling Gas Pressure |
| | COOL-GAS-P2 | He Center Cooling Gas Pressure |

Figure 6B:
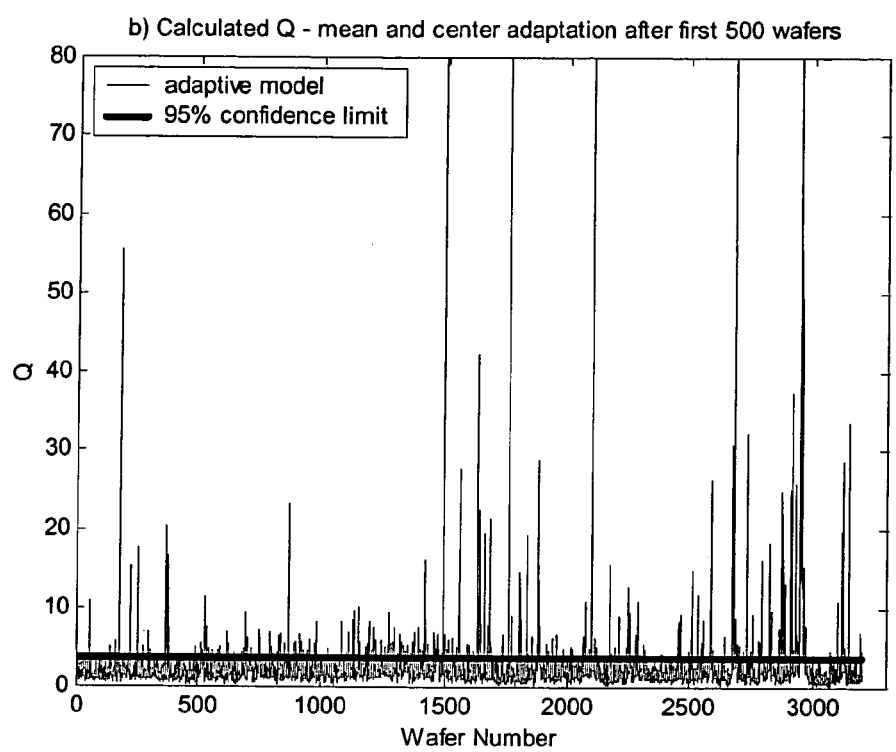
FIG. 6B presents an exemplary calculated Q-statistic using adaptive centering and scaling coefficients following the first 500 substrates.

FIG. 6B shows the same example of using a PCA model to monitor the Q-statistic that was presented in FIG. 6A, except that the centering and scaling coefficients are updated using an adaptation scheme in accordance with the present invention. As seen in this figure, after the first 500 wafers, when the centering and scaling constants are adapted using adaptive centering and scaling coefficients described above ($\lambda=0.92$; k=500), the Q-statistic chart is substantially more stable across all of the remaining substrates, and the data predominantly resides within the same limit. The inventive adaptation scheme provides similar improvement to other statistical monitoring schemes (e.g., the Hotelling $T^2$ parameter). Thus, adaptation of the PCA model in accordance with the present invention allows for a more robust PCA model that can be used for long process runs.

Figure 7:
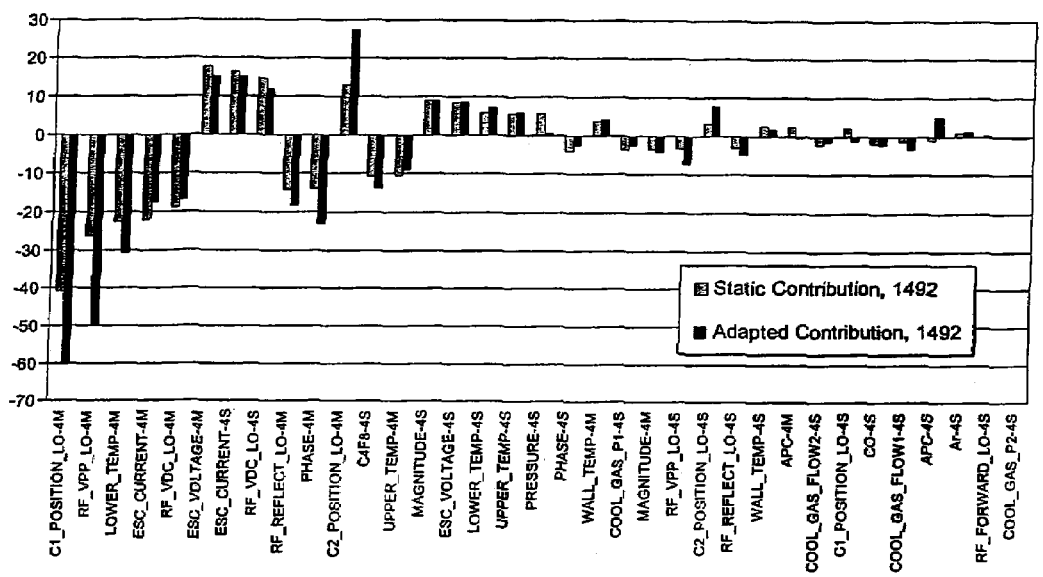
FIG. 7 presents an exemplary Q contribution plot.
Figure 8:
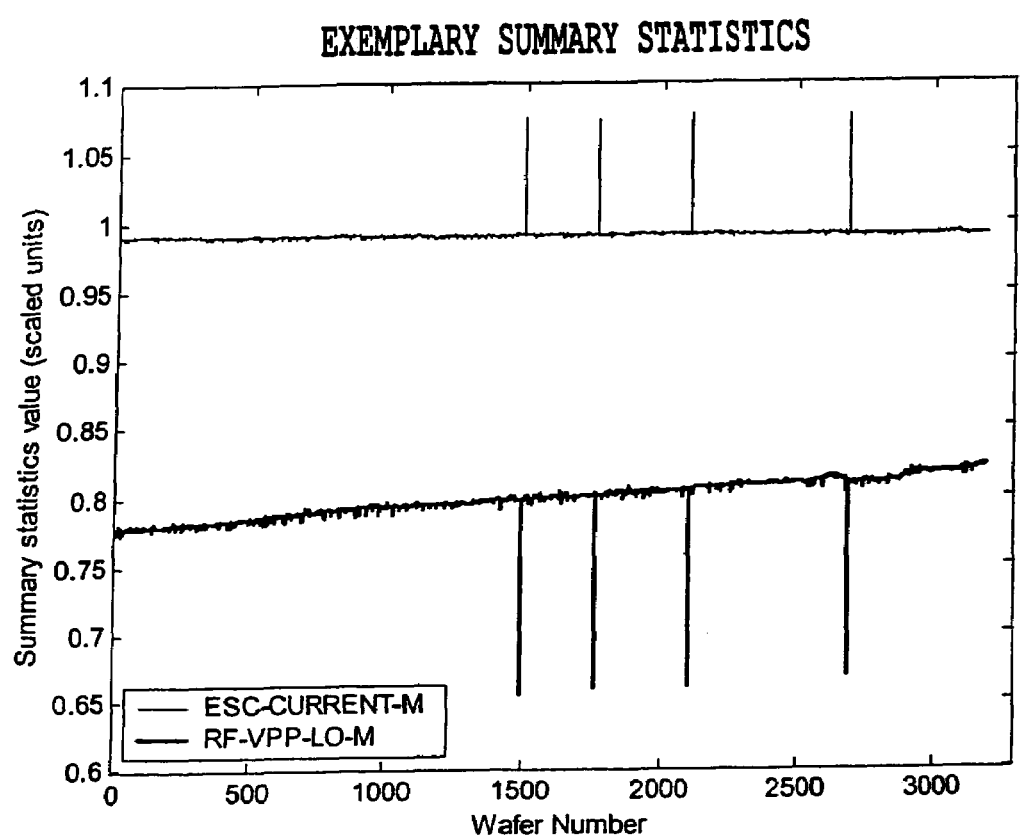
FIG. 8 presents an exemplary summary statistic for two data parameters.

Referring now to FIGS. 6A and 6B together, the first excursion of substantive magnitude is the run with the largest Q value in the adaptive case, which occurs for substrate 1492. In the residual contribution plots for both the static and adaptive cases (see FIG. 7), C1-POSITION-LO mean, RF-VPP-LO mean, and ESC-CURRENT are the extreme values. The arbitrarily scaled summary statistics for the latter two data parameters are plotted in FIG. 8. These three data parameters account for the large spikes in the data at four points, which could indicate an issue with the impedance match network system. This type of outlier is clear in both Q charts, but only the adaptive case allows for a fixed limit (e.g., 95% confidence limit) for all time.

In another embodiment, the relative change in the centering and scaling coefficients can be calculated to alert the operator or engineer that step summary statistics have shifted between two runs, or observations. For each centering coefficient, this is done by subtracting the estimate at an initial run from the estimate at a final run, then scaling each difference by the standard deviation used for scaling that step statistic for the initial run, viz.

$$M_{\overline{X}} = \left|\frac{\overline{X}_{M,j,b} - \overline{X}_{M,j,a}}{\sigma_{j,a}}\right|, \quad (10)$$

where $M_{\overline{X}}$ is the model mean movement metric, $\overline{X}_{M,j,a}$ represents the model mean value for the $j^{th}$ data parameter for the $a^{th}$ substrate, $\overline{X}_{M,j,b}$ represents the model mean value for the $j^{th}$ data parameter for the $b^{th}$ substrate, and $\sigma_{j,n}$ represents the model standard deviation for the $j^{th}$ data parameter for the $a^{th}$ substrate.

For the scaling coefficient, the calculation is the difference in standard deviations scaled with the mean used for centering that step statistic, viz.

$$M_\sigma = \left|\frac{\sigma_{j,b} - \sigma_{j,a}}{\overline{X}_{M,j,a}}\right|, \quad (11)$$

where $\sigma_{j,b}$ represents the model standard deviation for the $j^{th}$ data parameter for the $b^{th}$ substrate.

These results are then displayed in a Pareto chart to identify the variables that exhibited the largest relative change during the period. For example, this supplement to the typical contribution plot can give the operator insight on the global changes in the set of data parameters. In contrast, the contribution plot indicates the local deviation in a particular run.

Figure 9A:
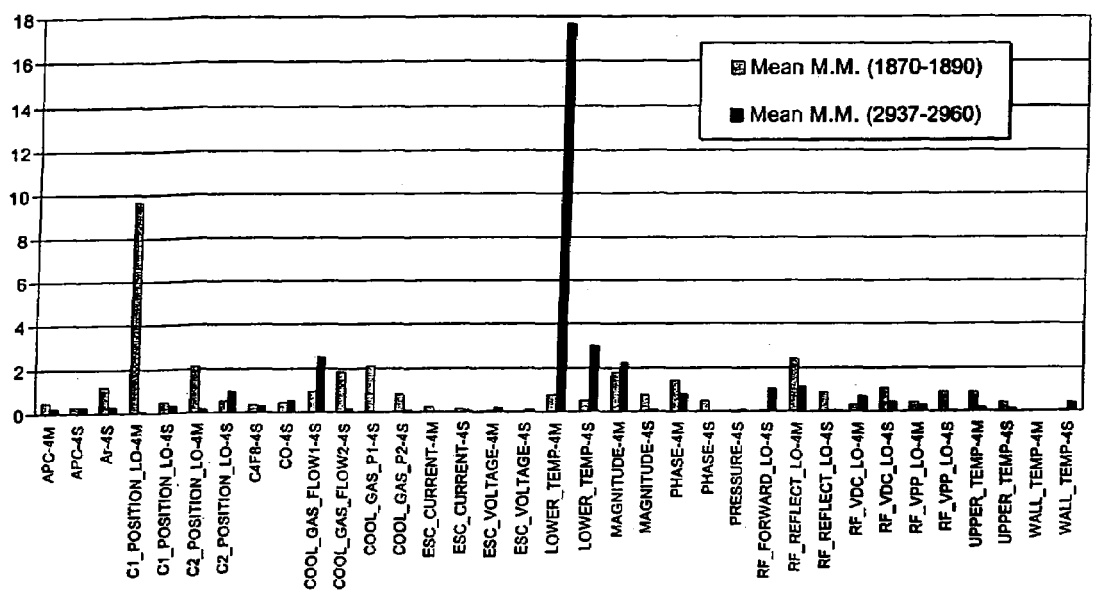
FIG. 9A presents an exemplary model mean movement metric plot for two substrate ranges.
Figure 9B:
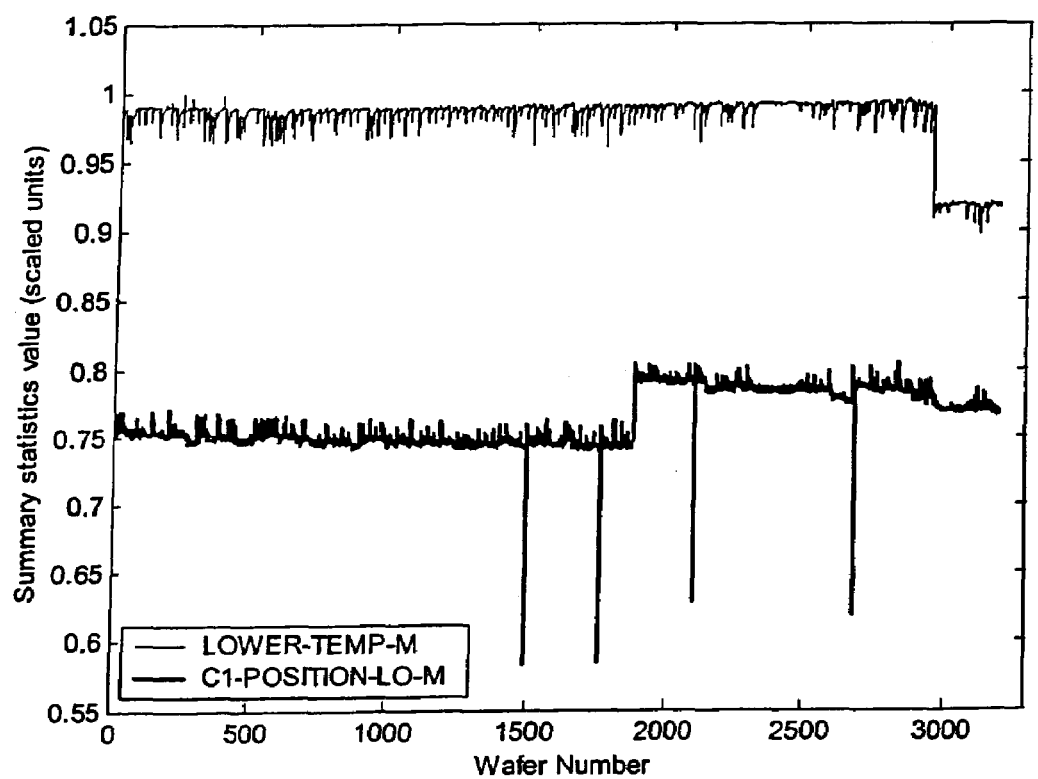
FIG. 9B presents an exemplary summary statistic for the highest values in the movement metric plot of FIG. 9A.

Referring again to FIGS. 6A and 6B, the next type of excursion is observed at steps in the input summary data. In the static case, these excursions are clearly evident in the Q chart, although automating detection of these changes proves to be quite difficult. In the adaptive case, there are only 4 periods where the Q statistic violates the confidence limit for more than 5 consecutive substrates (starting at substrates 1880, 2535, 2683, and 2948). When the model mean movement metric is calculated about each of these four periods (from the substrate before the period to the substrate after the period), the most extreme values occur for 1880 and 2946 on C1-POSITION-LO mean and WALL-TEMP mean, respectively. FIG. 9A presents the model mean movement metric and the model standard deviation metric for all of the data parameters. The arbitrarily scaled summary data for the two data parameters is displayed in FIG. 9B. The two major changes in the Q statistic seem to be dominated by these two data parameters. For example, the shift in these data parameters may have been caused by a tool cleaning, e.g., replacing key parts and changing the electrical or heat transfer characteristics of the processing system. Although the temperature is regulated in the processing system, this is done only at the upper electrode and walls. The lower temperature is not controlled and could be affected by different materials or part configurations in the processing system. The contribution plots for the static case and the adaptive case for substrate 1880 both are dominated by the C1-POSITION-LO. For substrate 2948, WALL-TEMP is the dominant contribution in the adaptive case, but in the static case it is only slightly larger than the C1-POSITION-LO value (which does not change at this run).

Figure 10:
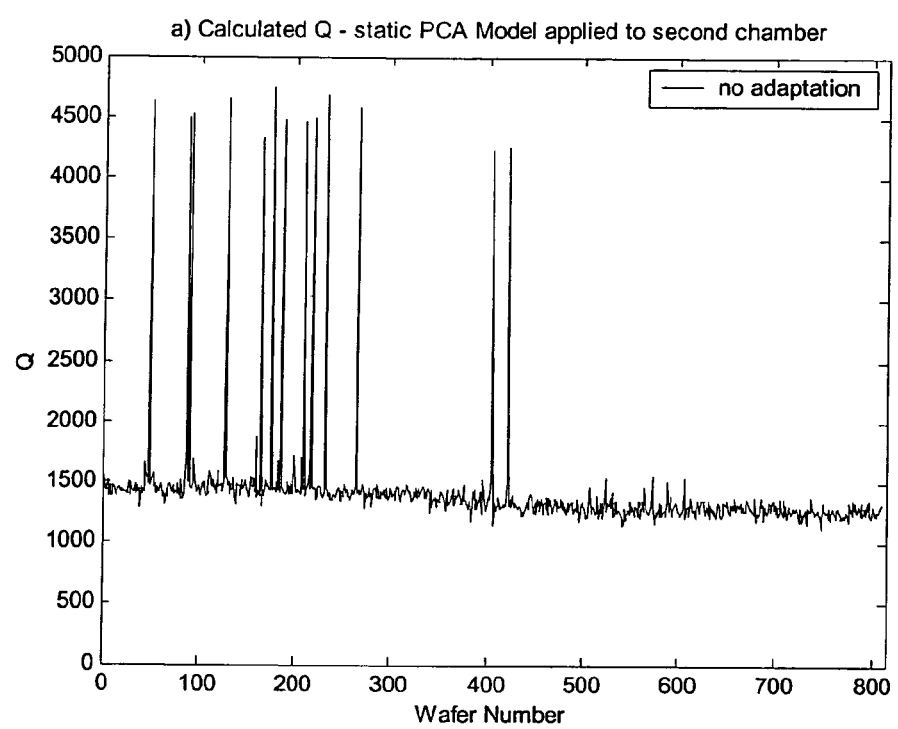
FIG. 10 presents an exemplary calculated Q-statistic using static centering and scaling coefficients applied to a second processing system.
Figure 11:
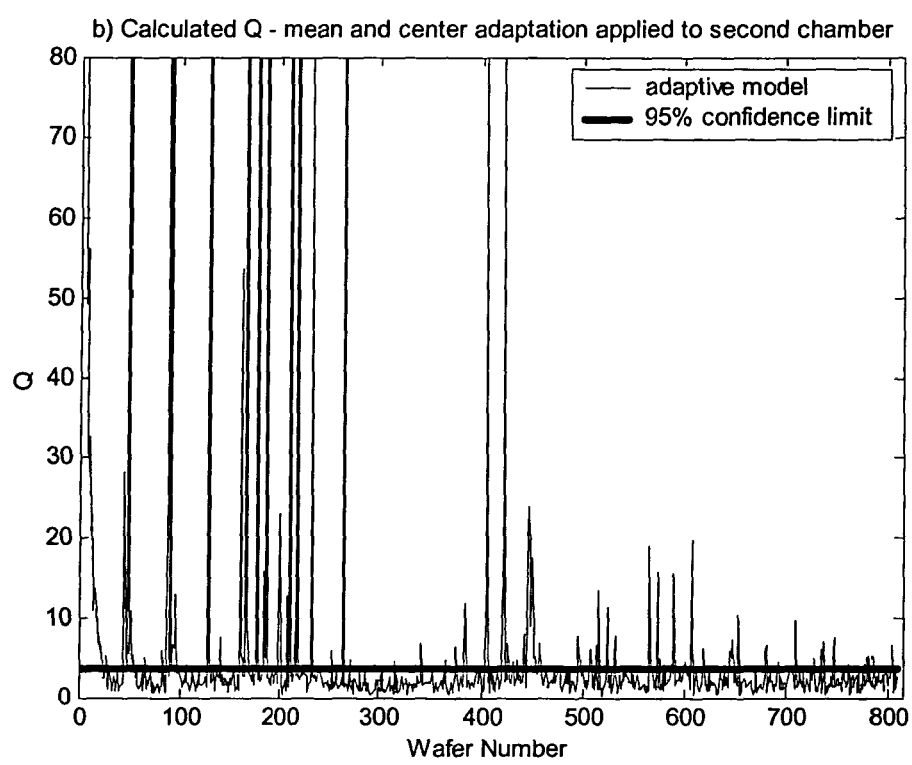
FIG. 11 presents an exemplary calculated Q-statistic using adaptive centering and scaling coefficients applied to a second processing system.

In addition to providing a more robust PCA model that can be used for statistical monitoring over long process runs, the adaptive technique also provides use of the same PCA model among different processing systems. FIGS. 10 and 11 illustrate a second example of the present invention wherein, after looking at the major changes over time for one processing system, the same model from the first 500 substrates was then applied to a set of 800 substrates from a second processing system. As seen in FIG. 10, the plot of the Q statistic for the static model is many orders of magnitude greater than the confidence limit for the model. Thus, statistical parameters derived from one conventional model for a given process in a given processing system are not transferable for the same process to another processing system. Moreover, as with the example of FIG. 6A described above, rebuilding the PCA model for each processing system or employing a complex control limit scheme to adapt the PCA model of one system to another system is impractical. FIG. 11 shows the same model with the adaptive centering and scaling coefficients of the present invention applied. The data returns below the confidence limit after only 25 substrates (the typical load for a single cassette). Increasing λ may provide an even faster recovery, but may result in overshoot problems. Once below the confidence limit, the same gross outliers are still evident, but other variations such as the region between substrate 445 and 455 are highlighted as well.

With this same model applied to a second processing system, again a contribution plot can be used to identify the cause of the single point excursions as described above. The contribution plot based on the static model provides a number of data parameters with no clear single cause, and few of those data parameters identified exhibit the large outlier characteristics. The contribution based on the adaptive scheme clearly indicates two parameters: RF-VPP-LO mean and APC standard deviation. These outliers are consistent with a plasma leak where the voltage has a high value throughout the step and the pressure control is very choppy as it tries to control an unstable plasma.

In order to investigate the sudden shifts of the system, periods of consecutive violations were noted from the data in FIG. 11. Three different regions occurring at substrates 1, 91, and 446 had more than five consecutive points exceeding the confidence limit. The movement metric for the first 22 substrates, where the model was adapting to the new processing system values, highlighted significant changes in RF-VPP-LO mean, ESC_VOLTAGE mean, C2-POSITION-LO mean, ESC-CURRENT mean, and RF-FORWARD-LO standard deviation, indicating that many of the electrical characteristics have offset between the two processing systems. The period beginning with substrate 91 has two of the large spikes within 5 runs, causing the movement metric to identify adaptation to the outliers. In the final region starting at substrate 446, the metric points to the APC mean and the COOL-GAS-FLOW1 standard deviation. The substrate summary data for these variables exhibit a crisp jump at this time. Further analysis would be necessary to speculate on a type of problem that would be characterized by a shift in the throttle valve angle used to control pressure and the variability in the helium flow used to control temperature on the lower electrode.

Thus, the present inventors have recognized that a static PCA model is inadequate for monitoring and detecting local faults on an industrial material processing system. The confidence limit on the model is quickly exceeded after the model is constructed; furthermore, the confidence limit is inappropriate when the model is applied to another processing system. The mean and standard deviation values, used for univariate scaling, can be slowly adapted with new data. The adaptive centering and scaling method is sufficient to keep the distance to the model in the residual space (Q) stable, and the original model confidence limit is appropriate for detecting excursions. In addition, the Q contributions calculated from the adaptive method help discriminate the root cause data parameters of the local deviation instead of being coupled to the contributions of those data parameters that have global changes. Supplemental to the contribution plot, the movement metric identified input data parameters that had sharp step changes during periods of consecutive confidence limit violations.

Figure 12:
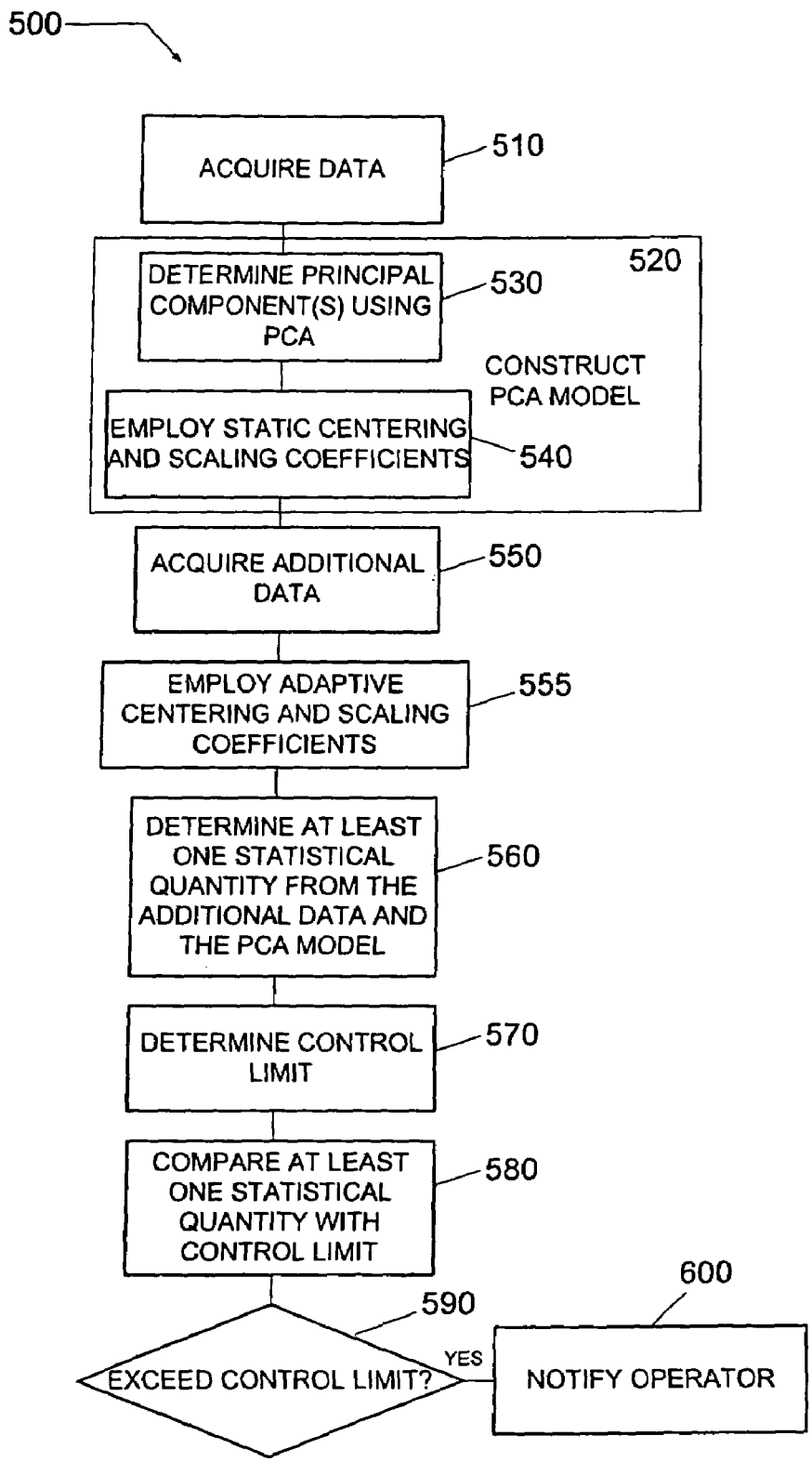
FIG. 12 illustrates a method of monitoing a processing system according to an embodiment of the present invention.

FIG. 12 presents a flow chart describing a method of monitoring a processing system for processing a substrate during the course of semiconductor manufacturing. The method 500 begins at 510 with acquiring data from the processing system for a plurality of observations. The processing system can, for example, be an etch system, or it may be another processing system as described in FIG. 1. The data from the processing system can be acquired using a plurality of sensors coupled to the processing system and a controller. The data can, for example, comprise any measurable data parameter, and any statistic thereof (e.g., mean, standard deviation, skewness, kurtosis, etc.). Additional data can, for example, include optical emission spectra, RF harmonics of voltage and/or current measurements or radiated RF emission, etc. Each observation can pertain to a substrate run, instant in time, time average, etc.

At 520, a PCA model is constructed from the acquired data parameters by determining one or more principal components to represent the data at 530 and applying static centering and scaling coefficients, as described above, to the data parameters of the acquired data at 540. For example, a commercially available software such as MATLAB™ and PLS Toolbox can be utilized to construct the PCA model.

At 550, additional data is acquired from a processing system, and, at 555, adaptive centering and scaling coefficients are utilized when applying the PCA model to the acquired data parameters. At 560, at least one statistical quantity is determined from the additional data and the PCA model. For example, the additional data can be forward projected onto the one or more principal components to determine a set of scores, and the set of scores can be backward projected onto the principal components to determine one or more residual errors. Utilizing either the set of scores in conjunction with the model set of scores, or the one or more residual errors, at least one statistical quantity can be determined, such as the Q-statistic, or the Hotelling $T^2$ parameter, for each additional observation.

At 570, a control limit can be set, and, at 580, at least one statistical quantity can be compared with the control limit. The control limit can be set using either subjective methods or empirical methods. For example, when using the Q-statistic, the control limit can be set at the 95% confidence limit (see, for instance, FIGS. 6A, 6B, and 11). Additionally, for example, when using the Hotelling $T^2$ parameter, the control limit can be set at the 95% confidence limit. Alternatively, for example, the control limit can be established by assuming a theoretical distribution for the statistical quantity, such as a $\chi^2$-distribution; however, the observed distribution should be verified with the theory. If the at least one statistical quantity exceeds the control limit, then a fault for the processing system is detected at 590, and an operator can be notified at 600.

Figure 13:
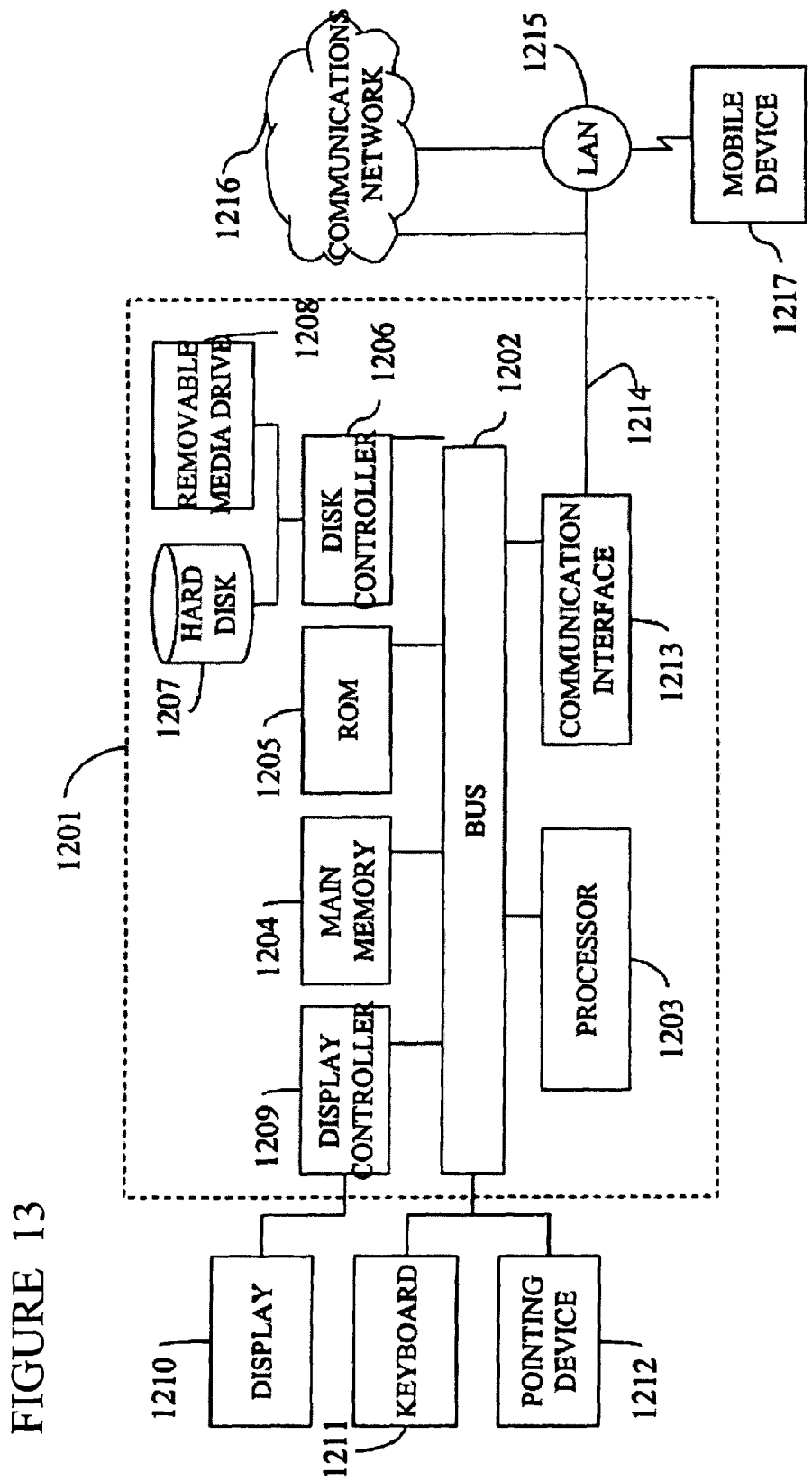
FIG. 13 presents a computer system for implementing various embodiments of the present invention.

FIG. 13 illustrates a computer system 1201 for implementing various embodiments of the present invention. The computer system 1201 may be used as the controller 55 to perform any or all of the functions of the controller described above. The computer system 1201 includes a bus 1202 or other communication mechanism for communicating information, and a processor 1203 coupled with the bus 1202 for processing the information. The computer system 1201 also includes a main memory 1204, such as a random access memory (RAM) or other dynamic storage device (e.g., dynamic RAM (DRAM), static RAM (SRAM), and synchronous DRAM (SDRAM)), coupled to the bus 1202 for storing information and instructions to be executed by processor 1203. In addition, the main memory 1204 may be used for storing temporary variables or other intermediate information during the execution of instructions by the processor 1203. The computer system 1201 further includes a read only memory (ROM) 1205 or other static storage device (e.g., programmable ROM (PROM), erasable PROM (EPROM), and electrically erasable PROM (EEPROM)) coupled to the bus 1202 for storing static information and instructions for the processor 1203.

The computer system 1201 also includes a disk controller 1206 coupled to the bus 1202 to control one or more storage devices for storing information and instructions, such as a magnetic hard disk 1207, and a removable media drive 1208 (e.g., floppy disk drive, read-only compact disc drive, read/write compact disc drive, compact disc jukebox, tape drive, and removable magneto-optical drive). The storage devices may be added to the computer system 1201 using an appropriate device interface (e.g., small computer system interface (SCSI), integrated device electronics (IDE), enhanced-IDE (E-IDE), direct memory access (DMA), or ultra-DMA).

The computer system 1201 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)).

The computer system 1201 may also include a display controller 1209 coupled to the bus 1202 to control a display 1210, such as a cathode ray tube (CRT), for displaying information to a computer user. The computer system includes input devices, such as a keyboard 1211 and a pointing device 1212, for interacting with a computer user and providing information to the processor 1203. The pointing device 1212, for example, may be a mouse, a trackball, or a pointing stick for communicating direction information and command selections to the processor 1203 and for controlling cursor movement on the display 1210. In addition, a printer may provide printed listings of data stored and/or generated by the computer system 1201.

The computer system 1201 performs a portion or all of the processing steps of the invention (such as for example those described in relation to FIG. 13). in response to the processor 1203 executing one or more sequences of one or more instructions contained in a memory, such as the main memory 1204. Such instructions may be read into the main memory 1204 from another computer readable medium, such as a hard disk 1207 or a removable media drive 1208. One or more processors in a multi-processing arrangement may also be employed to execute the sequences of instructions contained in main memory 1204. In alternative embodiments, hard-wired circuitry may be used in place of or in combination with software instructions. Thus, embodiments are not limited to any specific combination of hardware circuitry and software.

As stated above, the computer system 1201 includes at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the computer system 1201, for driving a device or devices for implementing the invention, and for enabling the computer system 1201 to interact with a human user (e.g., print production personnel). Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor 1203 for execution. A computer readable medium may take many forms, including but not limited to, non-volatile media, volatile media, and transmission media. Non-volatile media includes, for example, optical, magnetic disks, and magneto-optical disks, such as the hard disk 1207 or the removable media drive 1208. Volatile media includes dynamic memory, such as the main memory 1204. Transmission media includes coaxial cables, copper wire and fiber optics, including the wires that make up the bus 1202. Transmission media also may also take the form of acoustic or light waves, such as those generated during radio wave and infrared data communications.

Various forms of computer readable media may be involved in carrying out one or more sequences of one or more instructions to processor 1203 for execution. For example, the instructions may initially be carried on a magnetic disk of a remote computer. The remote computer can load the instructions for implementing all or a portion of the present invention remotely into a dynamic memory and send the instructions over a telephone line using a modem. A modem local to the computer system 1201 may receive the data on the telephone line and use an infrared transmitter to convert the data to an infrared signal. An infrared detector coupled to the bus 1202 can receive the data carried in the infrared signal and place the data on the bus 1202. The bus 1202 carries the data to the main memory 1204, from which the processor 1203 retrieves and executes the instructions. The instructions received by the main memory 1204 may optionally be stored on storage device 1207 or 1208 either before or after execution by processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices. For example, the network link 1214 may provide a connection to another computer through a local network 1215 (e.g., a LAN) or through equipment operated by a service provider, which provides communication services through a communications network 1216. The local network 1214 and the communications network 1216 use, for example, electrical, electromagnetic, or optical signals that carry digital data streams, and the associated physical layer (e.g., CAT 5 cable, coaxial cable, optical fiber, etc). The signals through the various networks and the signals on the network link 1214 and through the communication interface 1213, which carry the digital data to and from the computer system 1201 maybe implemented in baseband signals, or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1201 can transmit and receive data, including program code, through the network(s) 1215 and 1216, the network link 1214, and the communication interface 1213. Moreover, the network link 1214 may provide a connection through a LAN 1215 to a mobile device 1217 such as a personal digital assistant (PDA) laptop computer, or cellular telephone.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A method of monitoring a processing system for processing a substrate during the course of semiconductor manufacturing, comprising:

acquiring initial data from said processing system for a plurality of observations from a first set of substrate runs having performed a process in the processing system, said initial data comprising a plurality of data parameters;

constructing a principal components analysis (PCA) model from said data parameters of the first set, said PCA model including centering coefficients for the initial data from the first set;

acquiring additional data from said processing system after said constructing step from a second set of substrate runs performing said process in the processing system, said additional data comprising an additional observation of said plurality of data parameters;

adjusting said centering coefficients at the time of each observation of the additional data from the second set by utilizing both said initial data and current data obtained from the additional observation from the process performed in the second set to produce updated adaptive centering coefficients for each of said data parameters in said PCA model;

applying said updated adaptive centering coefficients to each of said data parameters in said PCA model created from the first set of substrate runs and unchanged;

determining at least one statistical quantity using a combination of said PCA model and the additional data that has been centered by the updated adaptive centering coefficients;

setting a control limit for said at least one statistical quantity;

comparing said at least one statistical quantity to said control limit in order to determine if the substrate processing remains within control during the course of semiconductor manufacturing for the second set; and providing an output assessing the process being performed in the processing system.

2. The method of claim 1, wherein said adjusting said centering coefficients comprises:

combining an old value of the adaptive centering coefficient for each data parameter and the current value of each data parameter for said additional observation, wherein said old value of the adaptive centering coefficient comprises a mean value of the data parameters obtained during said plurality of observations in the step of acquiring initial data from said processing system.

3. The method of claim 2, wherein said combining said old value of said adaptive centering coefficient and said current value of said data parameter for said additional observation comprises:

applying an exponentially weighted moving average (EWMA) filter.

4. The method of claim 3, wherein said applying said EWMA filter comprises:
setting a weighting factor.

5. The method of claim 4, wherein said setting said weighting factor comprises:
setting said weighting factor to a value ranging from 0.5 to 1.0.

6. The method of claim 5, wherein said setting said weighting factor comprises:
setting said weighting factor to a value ranging from 0.8 to 0.95.

7. The method of claim 1, wherein said applying said updated adaptive centering coefficients to each of said data parameters comprises:
subtracting said updated adaptive centering coefficients from each of said data parameters.

8. The method of claim 1, further comprising:
determining scaling coefficients for the PCA model;
adjusting the scaling coefficients to produce updated adaptive scaling coefficients for each of said data parameters in said PCA model; and
applying said updated adaptive scaling coefficients to each of said data parameters in said PCA model, wherein the determining at least one statistical quantity uses said additional data that has also been scaled by the updated adaptive scaling coefficients.

9. The method of claim 8, wherein said adjusting said scaling coefficients comprises:
applying a recursive standard deviation filter, said filter combining an old value of the adaptive scaling coefficient for each data parameter, a current value of each data parameter for said additional observation, and an old value of the adaptive centering coefficient for each data parameter,
wherein said old value of said adaptive scaling coefficient comprises a standard deviation of said data parameter during said plurality of observations and said old value of said adaptive centering coefficient comprises a mean value of said data parameters obtained during said plurality of observations in the step of acquiring initial data from said processing system.

10. The method of claim 9, wherein said applying said recursive standard deviation filter comprises setting a filter constant.

11. The method of claim 8, further comprising:
accessing said adaptive scaling coefficients via at least one of an intranet and an internet.

12. The method of claim 1, wherein said applying said updated adaptive scaling coefficients to each of said data parameters comprises dividing each of said data parameters by said updated scaling coefficients.

13. The method of claim 1, wherein said constructing said PCA model comprises:
determining one or more principal components of said initial data for said plurality of observations using principal components analysis.

14. The method of claim 1, further comprising:
detecting a process fault has occurred when said at least one statistical quantity exceeds said control limit.

15. The method of claim 1, wherein said plurality of data parameters comprises at least one of a capacitor position, a forward radio frequency (RF) power, a reflected RF power, a voltage, a current, a phase, an impedance, a RF peak-to-peak voltage, a RF self-induced direct current bias, a chamber pressure, a gas flow rate, a temperature, a backside gas pressure, a backside gas flow rate, an electrostatic clamp voltage, an electrostatic clamp current, a focus ring thickness, RF hours, a process step duration, focus ring RF hours, an optical emission spectrum, and RF harmonics.

16. The method of claim 1, wherein said plurality of data parameters comprises at least one of an instantaneous value, a time average, a standard deviation, a third moment, a fourth moment, and a variance.

17. The method of claim 1, wherein said statistical quantity comprises at least one of a Q-statistic and a Hotelling $T^2$ parameter.

18. The method of claim 1, further comprising:
accessing at least one of said initial data, said additional data, said adaptive centering coefficients, said at least one statistical quantity, and said control limit via at least one of an intranet and an internet.

19. In a process control system including a principal components analysis (PCA) model for monitoring a processing system for processing a substrate during the course of semiconductor manufacturing, the improvement comprising:
an adaptive centering coefficient for a data parameter obtained during a current observation made after construction of a PCA model from a first set of substrate runs having performed a process in the processing system,
said adaptive centering coefficient combining an old value of said adaptive centering coefficient and a current value of said data parameter for said current observation from a second set of substrate runs performing said process in the processing system to produce at each observation of data an updated adaptive centering coefficient, wherein said old value of said adaptive centering coefficient comprises a mean value of data parameters obtained during a plurality of observations preceding said current observation;
at least one statistical quantity determined using a combination of said PCA model created from the first set of substrate runs and unchanged and additional data acquired after construction of the PCA model that has been centered by the updated adaptive centering coefficients;
said updated adaptive centering coefficient implemented in the PCA model to provide, based on the statistical quantity, an improved process center for the substrate processing in order to update the substrate processing during the course of semiconductor manufacturing for the second set; and
said improved process center producing an output assessing the process being performed in the processing system.

20. The improvement of claim 19, wherein said combining said old value of said adaptive centering coefficient and said current value of said data parameter for said current observation comprises applying an exponentially weighted moving average (EWMA) filter.

21. The improvement of claim 20, wherein said applying said EWMA filter comprises setting a weighting factor.

22. The improvement of claim 21, wherein said setting said weighting factor comprises setting said weighting factor to a value ranging from 0 to 1.

23. The improvement of claim 22, wherein said setting said weighting factor comprises setting said weighting factor to a value ranging from 0.8 to 0.95.

24. The improvement of claim 19, wherein:
said adaptive centering coefficient is at least derived from an application of an exact recursive standard deviation formula, said formula combining an old value of the adaptive centering coefficient, a current value of each data parameter obtained for said current observation, and said old value of the adaptive centering coefficient, wherein said old value of said adaptive centering coefficient comprises a standard deviation of said data parameter during a plurality of observations preceding said current observation and said old value of said adaptive centering coefficient comprises the mean value of said data parameters obtained during a plurality of observations preceding said current observation.

25. A processing system for processing a substrate during the course of semiconductor manufacturing, comprising:

a process tool; and a process performance monitoring system coupled to said process tool and comprising a plurality of sensors coupled to said process tool and a controller coupled to said plurality of sensors and said process tool, wherein said controller includes, means for acquiring initial data from said plurality of sensors for a plurality of observations from a first set of substrate runs having performed a process in the processing system, said initial data comprising a plurality of data parameters, means for constructing a principal components analysis (PCA) model from said data parameters of the first set, said PCA model including centering coefficients for the initial data, means for acquiring additional data from said plurality of sensors after construction of the PCA model from a second set of substrate runs performing said process in the processing system, means for adjusting said centering coefficients at the time of each observation of the additional data by utilizing both previous run data from said initial data and current data obtained by the means for acquiring additional data to produce updated adaptive centering coefficients for each of said data parameters, means for applying said updated adaptive centering coefficients to each of said data parameters in said PCA model created from the first set of substrate runs and unchanged, means for determining at least one statistical quantity using a combination of said PCA model and the additional data that has been centered by the updated adaptive centering coefficients, means for setting a control limit for said at least one statistical quantity, means for comparing said at least one statistical quantity to said control limit in order to determine if the substrate processing remains within control during the course of semiconductor manufacturing for the second set; and means for providing an output assessing the process being performed in the processing system.

26. The processing system of claim 25, wherein said means for adjusting said centering coefficients comprises:

means for combining an old value of the adaptive centering coefficient for each data parameter and a current value of each data parameter for said additional data, wherein said old value of the adaptive centering coefficient comprises a mean value of the data parameters obtained during said plurality of observations by the means for acquiring data from said processing system.

27. The processing system of claim 25, further comprising:

means for determining scaling coefficients for the PCA model;

means for adjusting the scaling coefficients to produce updated adaptive scaling coefficients for each of said data parameters in said PCA model; and means for applying said updated adaptive scaling coefficients to each of said data parameters in said PCA model.

28. The processing system of claim 27, wherein said means for adjusting said scaling coefficients comprises:

means for applying a recursive standard deviation filter to said adaptive scaling coefficients, said filter combining an old value of the adaptive scaling coefficient for each data parameter, a current value of each data parameter for said additional data, and an old value of the adaptive centering coefficient for each data parameter, wherein said old value of said adaptive scaling coefficient comprises a standard deviation of said data parameter during said plurality of observations and said old value of said adaptive centering coefficient comprises a mean value of said data parameters obtained during said plurality of observations by the means for acquiring data from said processing system.

29. The processing system of claim 27, further comprising:

means for accessing at least one of said initial data, said additional data, said adaptive centering coefficients, said adaptive scaling coefficients, said at least one statistical quantity, and said control limit.

30. The processing system of claim 29, wherein said means for accessing comprises at least one of an intranet and an internet.

31. The processing system of claim 25, further comprising:

means for accessing at least one of said initial data, said additional data, said adaptive centering coefficients, said at least one statistical quantity, and said control limit.

32. The processing system of claim 31, wherein said means for accessing comprises at least one of an intranet and an internet.

33. A processing performance monitoring system to monitor a processing system for processing a substrate during the course of semiconductor manufacturing, comprising:

a plurality of sensors coupled to said processing system; and a controller coupled to said plurality of sensors and said processing system, wherein said controller includes, means for acquiring initial data from said plurality of sensors for a plurality of observations from a first set of substrate runs having performed a process in the processing system, said initial data comprising a plurality of data parameters, means for constructing a principal components analysis (PCA) model from said data parameters of the first set, said PCA model including centering coefficients for the initial data, means for acquiring additional data from said plurality of sensors acquired after construction of the PCA model from a second set of substrate runs performing said process in the processing system, means for adjusting said centering coefficients at the time of each observation of the additional data by utilizing both previous run data from said initial data and current data obtained by the means for acquiring additional data to produce updated centering coefficients for each of said data parameters, means for applying said updated adaptive centering coefficients to each of said data parameters in said PCA model created from the first set of substrate runs and unchanged, means for determining at least one statistical quantity using a combination of said PCA model and the additional data that has been centered by the updated adaptive centering coefficients, means for setting a control limit for said at least one statistical quantity, means for comparing said at least one statistical quantity to said control limit in order to determine if the substrate processing remains within control during the course of semiconductor manufacturing for the second set; and means for providing an output assessing the process being performed in the processing system.

34. The process performance monitoring system of claim 33, wherein said means for adjusting said centering coefficients comprises:

means for combining an old value of the adaptive centering coefficient for each data parameter and a current value of each data parameter for said additional data, wherein said old value of the adaptive centering coefficient comprises a mean value of the data parameters obtained during said plurality of observations by the means for acquiring data from said processing system.

35. The process performance monitoring system of claim 33, further comprising:

means for determining scaling coefficients for the PCA model;

means for adjusting the scaling coefficients to produce updated adaptive scaling coefficients for each of said data parameters in said PCA model; and means for applying said updated adaptive scaling coefficients to each of said data parameters in said PCA model.

36. The process performance monitoring system of claim 35, wherein said means for adjusting said scaling coefficients comprises:

means for applying a recursive standard deviation filter to said adaptive scaling coefficients, said filter combining an old value of the adaptive scaling coefficient for each data parameter, a current value of each data parameter for said additional observation, and an old value of the adaptive centering coefficient for each data parameter, wherein said old value of said adaptive scaling coefficient comprises a standard deviation of said data parameter during said plurality of observations and said old value of said adaptive centering coefficient comprises a mean value of said data parameters obtained during said plurality of observations by the means for acquiring initial data.

37. The process performance monitoring system of claim 35, further comprising:

means for accessing at least one of said initial data, said additional data, said adaptive centering coefficients, said adaptive scaling coefficients, said at least one statistical quantity, and said control limit.

38. The process performance monitoring system of claim 37, wherein said means for accessing comprises at least one of an intranet and an internet.

39. The process performance monitoring system of claim 33, further comprising:

means for accessing at least one of said initial data, said additional data, said adaptive centering coefficients, said at least one statistical quantity, and said control limit.

40. The process performance monitoring system of claim 37, wherein said means for accessing comprises at least one of an intranet and an internet.

41. A method of monitoring a first processing system for processing a substrate during the course of semiconductor manufacturing, comprising:

acquiring initial data from a processing system for a plurality of observations from a first set of substrate runs having performed a process in the processing system, said initial data comprising a plurality of data parameters;

constructing a principal components analysis (PCA) model from said data parameters of the first set, said PCA model including centering coefficients for the initial data;

acquiring additional data from said first processing system after constructing the PCA model from a second set of substrate runs performing said process in the processing system, said additional data comprises an additional observation of said plurality of data parameters;

adjusting said centering coefficients at the time of each observation of the additional data by utilizing both previous run data from said initial data and current data obtained from the additional observations to produce updated adaptive coefficients for each of said data parameters in said PCA model;

applying said updated adaptive centering coefficients to each of said data parameters in said PCA model created from the first set of substrate runs and unchanged;

determining at least one statistical quantity using a combination of said PCA model and the additional data that has been centered by the updated adaptive centering coefficients;

setting a control limit for said at least one statistical quantity;

comparing said at least one statistical quantity to said control limit in order to determine if the substrate processing remains within control during the course of semiconductor manufacturing for the second set; and providing an output assessing the process being performed in the processing system.

42. The method of claim 41, further comprising:

determining scaling coefficients for the PCA model;

adjusting the scaling coefficients to produce updated adaptive scaling coefficients for each of said data parameters in said PCA model; and applying said updated adaptive scaling coefficients to each of said data parameters in said PCA model.

43. A computer readable medium containing program instructions for execution on a computer system, which when executed by the computer system, cause the computer system to perform substrate processing comprising:

acquiring initial data from a processing system for a plurality of observations from a first set of substrate runs having performed a process in a processing system, said initial data comprising a plurality of data parameters;

constructing a principal components analysis (PCA) model from said data parameters of the first set, said PCA model including centering coefficients for the initial data;

acquiring additional data from said processing system after constructing the PCA model from a second set of substrate runs performing said process in the processing system, said additional data comprising an additional observation of said plurality of data parameters;

adjusting said centering coefficients by utilizing both previous run data from said initial data and current data obtained from the additional observation to produce updated adaptive centering coefficients for each of said data parameters in said PCA model;

applying said updated adaptive centering coefficients to each of said data parameters in said PCA model created from the first set of substrate runs and unchanged;

determining at least one statistical quantity using a combination of said PCA model and the additional data that has been centered by the updated adaptive centering coefficients;

setting a control limit for said at least one statistical quantity;

comparing said at least one statistical quantity to said control limit in order to determine if the substrate processing remains within control during the course of semiconductor manufacturing for the second set; and providing an output assessing the process being performed in the processing system.

44. A computer readable medium containing program instructions for execution on a computer system, which when executed by the computer system, cause the computer system to perform substrate processing comprising:

acquiring initial data from a second processing system for a plurality of observations from a first set of substrate runs having performed a process in a processing system, said initial data comprising a plurality of data parameters;

constructing a principal components analysis (PCA) model from said data parameters of the first set, said PCA model including centering coefficients for the initial data;

acquiring additional data from a first processing system after constructing the PCA model from a second set of substrate runs performing said process in the processing system, said additional data comprises an additional observation of said plurality of data parameters;

adjusting said centering coefficients by utilizing both previous run data from said initial data and current data obtained from the additional observation to produce updated adaptive centering coefficients for each of said data parameters in said PCA model;

applying said updated adaptive centering coefficients to each of said data parameters in said PCA model created from the first set of substrate runs and unchanged;

determining at least one statistical quantity using a combination of said PCA model and the additional data that has been centered by the updated adaptive centering coefficients;

setting a control limit for said at least one statistical quantity;

comparing said at least one statistical quantity to said control limit in order to determine if the substrate processing remains within control during the course of manufacturing for the second set; and providing an output assessing the process being performed in the processing system.

* * * * *